US012581739B2

(12) United States Patent
Luo

(10) Patent No.: US 12,581,739 B2
(45) Date of Patent: Mar. 17, 2026

(54) DRIVE SUBSTRATES, MANUFACTURING METHODS THEREOF, AND DISPLAY PANELS

(71) Applicant: Shenzhen China Star Optoelectronics Semiconductor Display Technology Co., Ltd., Guangdong (CN)

(72) Inventor: Chuanbao Luo, Guangdong (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 378 days.

(21) Appl. No.: 18/240,408

(22) Filed: Aug. 31, 2023

(65) Prior Publication Data

US 2025/0022891 A1     Jan. 16, 2025

Related U.S. Application Data

(63) Continuation of application No. PCT/CN2023/112867, filed on Aug. 14, 2023.

(30) Foreign Application Priority Data

Jul. 12, 2023     (CN) .......................... 202310849533.6

(51) Int. Cl.
*H10D 86/60*          (2025.01)
*H01L 25/16*          (2023.01)
(Continued)

(52) U.S. Cl.
CPC .......... *H10D 86/60* (2025.01); *H01L 25/167* (2013.01); *H10D 86/0231* (2025.01); *H10D 86/451* (2025.01)

(58) Field of Classification Search
CPC .............. H01L 25/167; H10D 86/0231; H10D 86/421; H10D 86/471; H10D 86/451
See application file for complete search history.

(56) References Cited

U.S. PATENT DOCUMENTS

2012/0249503 A1* 10/2012 Teraguchi .............. H10K 59/38
                                                                345/206
2013/0082270 A1*  4/2013 Ono ........................ H10D 86/60
                                                                438/34

(Continued)

FOREIGN PATENT DOCUMENTS

CN          108020968          5/2018
CN          116581132          8/2023
(Continued)

OTHER PUBLICATIONS

International Search Report and the Written Opinion Dated Feb. 4, 2024 From the International Searching Authority Re. Application No. PCT/CN2023/112867 and its Translation of the Search Report into English. (16 Pages).

*Primary Examiner* — Mohsen Ahmadi

(57)          ABSTRACT

A drive substrate comprising: a substrate; a first active layer disposed on the substrate; a first insulating layer disposed on the first active layer; a first gate disposed on the first insulating layer; a second insulating layer disposed on the first gate; a second active layer disposed on the second insulating layer; a first electrode and a second electrode disposed on the substrate; a third insulating layer disposed on the first electrode and the second electrode; a third electrode disposed on the third insulating layer.

20 Claims, 12 Drawing Sheets

(51) Int. Cl.
    *H10D 86/01*          (2025.01)
    *H10D 86/40*          (2025.01)

(56) References Cited

U.S. PATENT DOCUMENTS

| 2019/0280061 | A1* | 9/2019 | Joo | .................... | H10K 59/1213 |
| 2022/0102390 | A1* | 3/2022 | Lee | .................... | G02F 1/16756 |
| 2022/0165832 | A1* | 5/2022 | Choi | .................... | H10K 59/131 |
| 2022/0406879 | A1* | 12/2022 | Cheng | .................. | H10K 59/122 |
| 2023/0238401 | A1* | 7/2023 | Lu | ....................... | H10D 86/0221 |
| 2024/0014365 | A1* | 1/2024 | Lee | .................... | H10H 20/857 |
| 2024/0038778 | A1* | 2/2024 | Yi | .......................... | H10H 29/10 |

FOREIGN PATENT DOCUMENTS

| KR | 10-2015-0101417 | 9/2015 |
| KR | 10-2017-0079624 | 7/2017 |
| KR | 10-2020-0080056 | 7/2020 |

* cited by examiner

DRIVE SUBSTRATES, MANUFACTURING METHODS THEREOF, AND DISPLAY PANELS

RELATED APPLICATIONS

This application is a Continuation of PCT Patent Application No. PCT/CN2023/112867 filed on Aug. 14, 2023, which claims the benefit of priority of Chinese Patent Application No. 202310849533.6 filed on Jul. 12, 2023. The contents of the above applications are all incorporated by reference as if fully set forth herein in their entirety.

TECHNICAL FIELD

The present application relates to display technology, and more particularly, to drive substrates, manufacturing methods thereof, and display panels.

BACKGROUND

Mini/Micro-LED display technology has entered a stage of accelerated development in recent years, and may be used in small-sized and medium-sized high value-added display applications. In the Mini/Micro-LED display technology, a drive backplane is a key technology. In order to achieve high mobility, high-mobility materials such as IGTO and IGZTO are usually used to make double-gate and double-active-layer thin film transistors, but the method of manufacturing this structure is currently complicated.

SUMMARY

An embodiment of the present application provides a drive substrate including:

a substrate;

a first active layer disposed on the substrate, the first active layer including a first channel, a first conductor portion connected to a side of the first channel, and a second conductor portion connected to other side of the first channel;

a first insulating layer disposed on the first active layer;

a first gate disposed on the first insulating layer and overlapping the first channel;

a second insulating layer disposed on the first gate and provided with a first opening;

a second active layer disposed on the second insulating layer, wherein the second active layer includes a second channel and a third conductor portion connected to a side of the second channel, and the third conductor portion is connected to the second conductor portion through the first opening, and is provided to overlap the second conductor portion;

a first electrode and a second electrode disposed on the substrate, wherein the first electrode is connected to the first conductor portion, the second electrode is disposed on the second active layer and connected to a side of the second active layer away from the third conductor portion;

a third insulating layer disposed on the first electrode and the second electrode and provided with a second opening; and a third electrode disposed on the third insulating layer, wherein the third electrode is connected to the second electrode through the second opening, and the third electrode shields the first channel and the second channel in a direction in which the drive substrate is orthographically projected, and exposes at least the second conductor portion and the third conductor portion.

Alternatively, in some embodiments of the present application, the drive substrate further includes a buffer layer disposed between the substrate and the first active layer, the first electrode is disposed between the buffer layer and the substrate, and the third electrode further exposes the first conductor portion.

Alternatively, in some embodiments of the present application, the first electrode shields the first channel and the second channel, and the first electrode includes a light shielding material.

Alternatively, in some embodiments of the present application, a resistance value of the first conductor portion and a resistance value of the second conductor portion are both lesser than a resistance value of the third conductor portion.

Alternatively, in some embodiments of the present application, the first electrode and the second electrode are arranged in a same layer and spaced apart from each other.

Alternatively, in some embodiments of the present application, a resistance value of the second conductor portion is lesser than a resistance value of the third conductor portion.

Alternatively, in some embodiments of the present application, the first channel and the second channel have a same material.

Alternatively, in some embodiments of the present application, the drive substrate further includes a third active layer, a second gate, a fourth electrode, and a fifth electrode, wherein the third active layer is disposed in a same layer as and spaced apart from the first active layer, the third active layer includes a third channel, a fourth conductor portion, and a fifth conductor portion, the fourth conductor portion is connected to a side of the third channel, and the fifth conductor portion is connected to other side of the third channel, the second gate is a same layer as and spaced apart from the first gate, the fourth electrode is connected to the fourth conductor portion, and the fifth electrode is connected to the fifth conductor portion;

the drive substrate includes a display region and a non-display region located at at least one side of the display region, and the first active layer, the second active layer, the first gate, the first electrode, and the second electrode are configured to form a first thin film transistor, and the third active layer, the second gate, the fourth electrode, and the fifth electrode are configured to form a second thin film transistor; and the first thin film transistor is disposed in the non-display region, and the second thin film transistor is disposed in the display region.

Alternatively, in some embodiments of the present application, a resistance value of the second conductor portion is lesser than a resistance value of the fifth conductor portion.

Accordingly, an embodiment of the present application further provides a display panel including a drive substrate and a light emitting device disposed on the drive substrate according to any one of the above embodiments;

The drive substrate includes:

a substrate;

a first active layer disposed on the substrate, the first active layer including a first channel, a first conductor portion connected to a side of the first channel, and a second conductor portion connected to other side of the first channel;

a first insulating layer disposed on the first active layer;

a first gate disposed on the first insulating layer and overlapping the first channel;

a second insulating layer disposed on the first gate and provided with a first opening;

a second active layer disposed on the second insulating layer, wherein the second active layer includes a second channel and a third conductor portion connected to a side of the second channel, and the third conductor portion is connected to the second conductor portion through the first opening, and is provided to overlap the second conductor portion;

a first electrode and a second electrode disposed on the substrate, wherein the first electrode is connected to the first conductor portion, the second electrode is disposed on the second active layer and connected to a side of the second active layer away from the third conductor portion;

a third insulating layer disposed on the first electrode and the second electrode and provided with a second opening; and a third electrode disposed on the third insulating layer, wherein the third electrode is connected to the second electrode through the second opening, and the third electrode shields the first channel and the second channel in a direction in which the drive substrate is orthographically projected, and exposes at least the second conductor portion and the third conductor portion.

Alternatively, in some embodiments of the present application, the drive substrate further includes a buffer layer disposed between the substrate and the first active layer, the first electrode is disposed between the buffer layer and the substrate, and the third electrode further exposes the first conductor portion.

Alternatively, in some embodiments of the present application, the first electrode shields the first channel and the second channel, and the first electrode includes a light shielding material.

Alternatively, in some embodiments of the present application, a resistance value of the first conductor portion and a resistance value of the second conductor portion are both lesser than a resistance value of the third conductor portion.

Alternatively, in some embodiments of the present application, the first electrode and the second electrode are arranged in a same layer and spaced apart from each other.

Alternatively, in some embodiments of the present application, a resistance value of the second conductor portion is lesser than a resistance value of the third conductor portion.

Alternatively, in some embodiments of the present application, the first channel and the second channel have a same material.

Alternatively, in some embodiments of the present application, the drive substrate further includes a third active layer, a second gate, a fourth electrode, and a fifth electrode, wherein the third active layer is disposed in a same layer as and spaced apart from the first active layer, the third active layer includes a third channel, a fourth conductor portion, and a fifth conductor portion, the fourth conductor portion is connected to a side of the third channel, and the fifth conductor portion is connected to other side of the third channel, the second gate is a same layer as and spaced apart from the first gate, the fourth electrode is connected to the fourth conductor portion, and the fifth electrode is connected to the fifth conductor portion;

the drive substrate includes a display region and a non-display region located at at least one side of the display region, and the first active layer, the second active layer, the first gate, the first electrode, and the second electrode are configured to form a first thin film transistor, and the third active layer, the second gate, the fourth electrode, and the fifth electrode are configured to form a second thin film transistor; and the first thin film transistor is disposed in the non-display region, and the second thin film transistor is disposed in the display region.

Alternatively, in some embodiments of the present application, a resistance value of the second conductor portion is lesser than a resistance value of the fifth conductor portion.

Accordingly, an embodiment of the present application further provides a method of manufacturing a drive substrate, including:

forming a first active layer on the substrate, wherein the first active layer includes a first contact portion, a first channel, and a second contact portion connected in sequence;

forming a first insulating layer on the first active layer;

forming a first gate on the first insulating layer in a region corresponding to the first channel;

forming a second insulating layer on the first gate;

forming a second active layer on the second insulating layer in a region corresponding to the first channel and the second contact portion, wherein the second active layer includes a third contact portion, a second channel, and a fourth contact portion connected in sequence, the fourth contact portion overlaps the second contact portion, and the fourth contact portion is connected to the second contact portion;

forming a first electrode and a second electrode on the substrate, wherein the first electrode is connected to the first contact portion, and the second electrode is connected to and disposed on the third contact portion;

forming a third insulating layer on the second electrode; and forming a third electrode on the third insulating layer in a region corresponding to the first gate, and performing a conductorization process on at least the second contact portion and the fourth contact portion by using the third electrode as a mask, to form a second conductor portion of the first active layer and a third conductor portion of the second active layer, wherein the third electrode is connected to the second electrode, and the third conductor portion is connected to the second conductor portion.

Alternatively, in some embodiments of the present application, the method further includes: after forming the first gate, performing a conductorization process on the first contact portion and the second contact portion by using the first gate as a mask, to form the first conductor portion and the second conductor portion.

DETAILED DESCRIPTION

Figure 1:
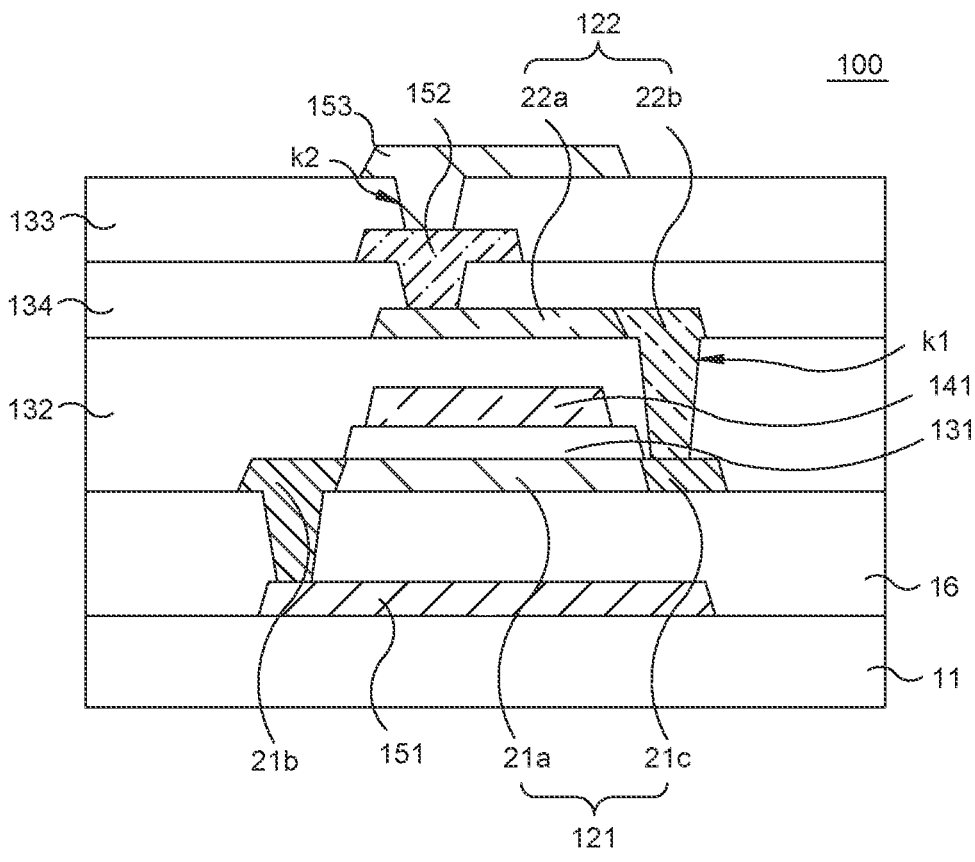
FIG. 1 is a schematic view of a drive substrate according to an embodiment of the present application.

Technical solutions in embodiments of the present application will be clearly and completely described below in connection with the accompanying drawings in the embodiments of the present application. It will be apparent that the described embodiments are merely a part of the embodiments of the present application, rather than all the embodiments. Based on the embodiments in the present application, all other embodiments obtained by a person skilled in the art without involving any inventive effort are within the scope of the present application. Furthermore, it is to be understood that the detailed embodiments described herein are for purposes of illustration and explanation only and are not intended to limit the present application. In the present application, unless otherwise stated, directional words used such as "upper" and "lower" generally refer to the upper and lower directions of the device in actual use or working state, and specifically refer to the drawing directions in the drawings; and "inner" and "outer" refer to the outline of the device.

An embodiment of the present application provides a drive substrate, a manufacturing method thereof, and a display panel. It is understood that the drive substrate may be used for a variety of panels, such as a miniature light-emitting diode panel, a liquid crystal panel, an organic light-emitting diode panel, a quantum dot light-emitting diode panel, or the like. Detailed description is given below. It should be noted that the order in which the following embodiments are described is not intended to limit the preferred order of the embodiments.

Embodiment 1

Referring to FIG. 1, an embodiment of the present application provides a drive substrate 100 including a substrate 11, a first active layer 121, a first insulating layer 131, a first gate 141, a second insulating layer 132, a second active layer 122, a first electrode 151, a second electrode 152, a third insulating layer 133, and a third electrode 153.

The first active layer 121 is disposed on the substrate 11. The first active layer 121 includes a first channel 21*a*, a first conductor portion 21*b* connected to a side of the first channel 21*a*, and a second conductor portion 21*c* connected to the other side of the first channel 21*a*. The first insulating layer 131 is disposed on the first active layer 121. The first gate 141 is disposed on the first insulating layer 131 and overlaps the first channel 21*a*. The second insulating layer 132 is disposed on the first gate 141. The second insulating layer 132 is provided with a first opening k1.

The second active layer 122 is disposed on the second insulating layer 132. The second active layer 122 includes a second channel 22*a* and a third conductor portion 22*b* connected to a side of the second channel 22*a*. The third conductor portion 22*b* is connected to the second conductor portion 21*c* through the first opening k1, and is provided to overlap the second conductor portion 21*c*.

The first electrode 151 and the second electrode 152 are disposed on the substrate 11. The first electrode 151 is connected to the first conductor portion 21*b*. The second electrode 152 is disposed on the second active layer 122 and connected to a side of the second active layer 122 away from the third conductor portion 22b.

The third insulating layer 133 is disposed on the first electrode 151 and the second electrode 152. The third insulating layer 133 is provided with a second opening k2.

The third electrode 153 is disposed on the third insulating layer 133. The third electrode 153 is connected to the second electrode 152 through the second opening k2. In a direction in which the drive substrate 100 is orthographically projected, the third electrode 153 covers the first channel 21a and the second channel 22a, and exposes at least the second conductor portion 21c and the third conductor portion 22b.

The first active layer 121, the first gate 141, the second active layer 122, the first electrode 151, and the second electrode 152 of the drive substrate 100 according to an embodiment of the present application are configured to form a thin film transistor. The thin film transistor adopts an architecture in which the shared first gate 141 and the dual active layers (the first active layer 121 and the second active layer 122) are provided, to improve the mobility of the driving thin film transistor. In addition, in a manufacturing process, at least the second conductor portion 21c and the third conductor portion 22b are formed by only one doping or conductorization process by using the third electrode 153 as a mask, so that the doping or conductorization processes are reduced.

Next, when the thin film transistor is configured to drive a light-emitting device such as a miniature light-emitting diode, since the third electrode 153 is used as a mask, to shield the first channel 21a and the first gate 141, the thin film transistor has a greater area, thereby facilitating bonding of a pin of the light-emitting device to the third electrode 153. That is, the third electrode 153 is used as both a mask and a bonding pad.

Next, since the first active layer 121 and the second active layer 122 are stacked, it is convenient to realize a narrow channel and further improve the field effect mobility.

Alternatively, one of the first electrode 151 and the second electrode 152 is a source and the other is a drain. That is, when the first electrode 151 is a source electrode, the second electrode 152 is a drain electrode. When the first electrode 151 is a drain electrode, the second electrode 152 is a source electrode.

Alternatively, the drive substrate 100 further includes a buffer layer 16 disposed between the substrate 11 and the first active layer 121. The first electrode 151 is disposed between the buffer layer 16 and the substrate 11. The first conductor portion 21b is further exposed by the third electrode 153.

The first conductor portion 21b is further exposed by the third electrode 153. In the manufacturing process, contact regions of the first active layer 121 and the second active layer 122 may be formed by one conductorization process by using the third electrode 153 as a mask, to form the first conductor portion 21b in a same process, the second conductor portion 21c, and the third conductor portion 22b, thereby reducing process steps.

Alternatively, the first electrode 151 shields the first channel 21a and the second channel 22a, and the first electrode 151 includes a light shielding material.

The first electrode 151 is made of a light-shielding material, and may shield the first channel 21a and the second channel 22a, thereby reducing the risk of the first channel 21a and the second channel 22a being illuminated.

Alternatively, the resistance values of the first conductor portion 21b and the second conductor portion 21c are both lesser than the resistance value of the third conductor portion 22b.

It will be appreciated that before the first active layer 121 and the second active layer 122 are formed in a conductorization process by using the third electrode 153 as a mask, another conductorization process may be performed. For example, the first active layer 121 is processed in a conductorization process by using the first gate 141 as a mask, to form the first conductor portion 21b and the second conductor portion 21c. Subsequently, the first active layer 121 and the second active layer 122 are processed in another conductorization process so that the resistance values of the first conductor portion 21b and the second conductor portion 21c are lesser than that of the third conductor portion 22b to improve the conductive efficiency.

Alternatively, the material of the first channel 21a is same as that of the second channel 22a to facilitate conductorization process.

Accordingly, an embodiment of the present application further provides a method of manufacturing a drive substrate 100, including the following steps.

A first active layer is formed on the substrate. The first active layer includes a first contact portion, a first channel, and a second contact portion connected in sequence.

A first insulating layer and a first gate are formed on the first active layer 1. The first gate corresponds to the first channel.

A second insulating layer is formed on the first gate.

A second active layer is formed on the second insulating layer in a region corresponding to the first channel and the second contact portion. The second active layer includes a third contact portion, a second channel, and a fourth contact portion connected in sequence. The fourth contact portion overlaps the second contact portion, and the fourth contact portion is connected to the second contact portion.

A first electrode and a second electrode are formed on the substrate. The first electrode is connected to the first contact portion, and the second electrode is connected to the third contact portion.

A third insulating layer is formed on the second electrode.

A third electrode is formed on the third insulating layer in a region corresponding to the first gate, and at least the second contact portion and the fourth contact portion are subjected to a conductorization process by using the third electrode as a mask, to form a second conductor portion of the first active layer and a third conductor portion of the second active layer. The third electrode is connected to the second electrode, and the third conductor portion is connected to the second conductor portion.

It should be noted that the above steps are not intended to limit an order thereof.

According to the method of manufacturing the drive substrate 100 according to an embodiment of the present invention, the first active layer 121, the first gate 141, the second active layer 122, the first electrode 151, and the second electrode 152 of the drive substrate 100 are configured to form a thin film transistor. The thin film transistor adopts an architecture in which the shared first gate 141 and the dual active layers (the first active layer 121 and the second active layer 122) are provided, to improve the mobility of the driving thin film transistor. In addition, in a manufacturing process, at least the second conductor portion 21c and the third conductor portion 22b are formed by only one doping or conductorization process by using the third electrode 153 as a mask, so that the doping or conductorization processes are reduced.

Next, when the thin film transistor is configured to drive a light-emitting device such as a miniature light-emitting diode, since the third electrode 153 is used as a mask, to shield the first channel 21*a* and the first gate 141, the thin film transistor has a greater area, thereby facilitating bonding of a pin of the light-emitting device to the third electrode 153. That is, the third electrode 153 is used as both a mask and a bonding pad.

Next, since the first active layer 121 and the second active layer 122 are stacked, it is convenient to realize a narrow channel and further improve the field effect mobility.

Alternatively, the method of manufacturing the drive substrate 100 according to an embodiment includes the following steps.

At Step B1, a first active layer 121 is formed on a substrate 11. The first active layer 121 includes a first contact portion 211, a first channel 21*a*, and a second contact portion 212 connected in sequence.

At Step B2, a first insulating layer 131 and a first gate 141 are formed on the first active layer 121. The first gate 141 corresponds to the first channel 21*a*.

At Step B3, a second insulating layer 132 is formed on the first gate 141.

At Step B4, a second active layer 122 is formed on the second insulating layer 132 in a region corresponding to the first channel 21*a* and the second contact portion 212. The second active layer 122 includes a third contact portion 221, a second channel 22*a*, and a fourth contact portion 222 connected in sequence. The fourth contact portion 222 overlaps the second contact portion 212, and the fourth contact portion 222 is connected to the second contact portion 212.

At Step B5, a second electrode 152 is formed on the substrate 11. The second electrode 152 is connected to the third contact portion 221.

At Step B6, a third insulating layer 133 is formed on the second electrode 152.

At Step B7, a third electrode 153 is formed on the third insulating layer 133 in a region corresponding to the first gate 141, and at least the second contact portion 212 and the fourth contact portion 222 are subjected to a conductorization process by using the third electrode 153 as a mask, to form a second conductor portion 21*c* of the first active layer 121 and a third conductor portion 22*b* of the second active layer 122.

The third electrode 153 is connected to the second electrode 152, and the third conductor portion 22*b* is connected to the second conductor portion 21*c*.

The method of manufacturing the drive substrate 100 is described below.

Figure 2:
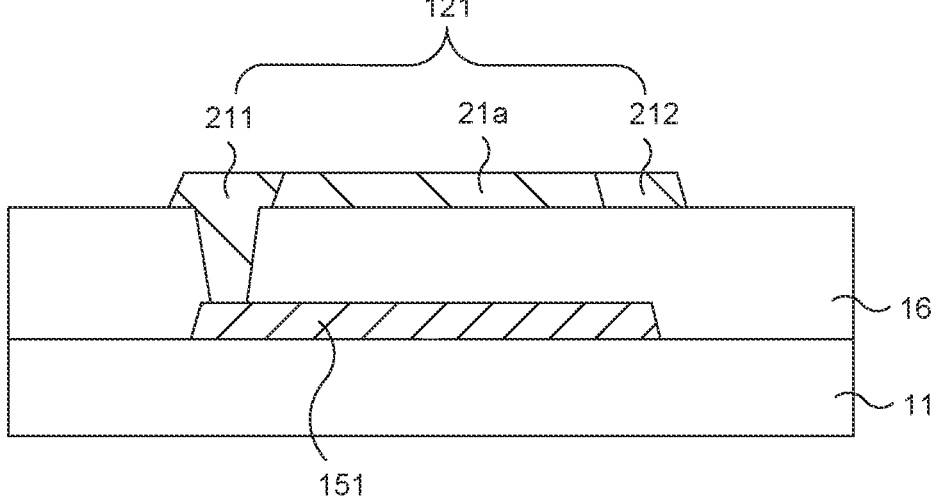
FIG. 2 is a schematic view of Step B1 of a method for manufacturing a drive substrate according to an embodiment of the present application.

At Step B1, referring to FIG. 2, the first active layer 121 is formed on the substrate 11. The first active layer 121 includes the first contact portion 211, the first channel 21*a*, and the second contact portion 212 connected in sequence.

Alternatively, the method further includes: before Step B1, sequentially forming a first electrode 151 and a buffer layer 16 on the substrate 11, the buffer layer 16 covering the first electrode 151 and the substrate 11.

Alternatively, the material of the first electrode 151 may be selected from one of molybdenum, aluminum, copper, titanium, indium zinc oxide, and indium tin oxide, or a combination thereof. The first electrode 151 may be a single-layer structure or a multi-layer stacked structure such as Mo, Mo/Al, Mo/Cu, MoTi/Cu, MoTi/Cu/MoTi, Ti/Al/Ti, Ti/Cu/Ti, Mo/Cu/IZO, IZO/Cu/IZO, or Mo/Cu/ITO.

Alternatively, the material of the buffer layer 16 may be $SiO_x$, $SiN_x$, $SiN_x/SiO_x$, $SiNO_x$, or the like.

Alternatively, the material of the first active layer 121 may be polysilicon or metal oxide. The polysilicon may be obtained by crystallization of amorphous silicon by using a laser annealing process or other crystallization methods. The metal oxide may be, for example, IGZO, IGTO, IGZO, IGO, IZO, AIZO, ATZO, or the like.

This then proceeds to Step B2.

Figure 3:
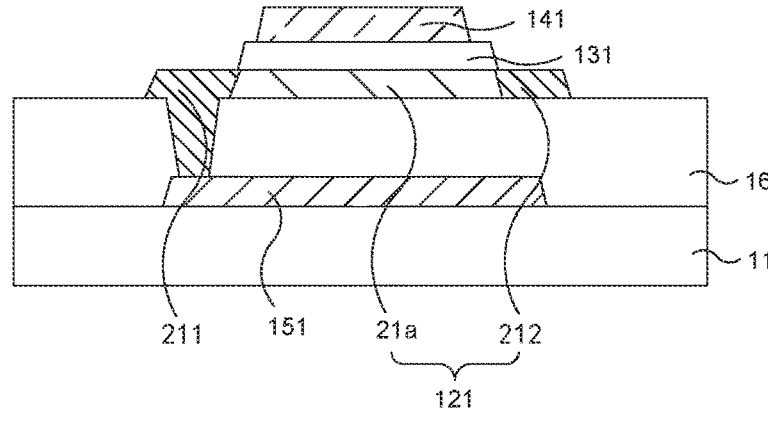
FIG. 3 is a schematic view of Step B2 of a method for manufacturing a drive substrate according to an embodiment of the present application.

At Step B2, referring to FIG. 3, the first insulating layer 131 and the first gate 141 are formed on the first active layer 121. The first gate 141 corresponds to the first channel 21*a*.

Alternatively, the first insulating layer 131 may be a single-layer structure or a multi-layer stacked structure, and the material of the first insulating layer 131 may be $SiO_x$, $Al_2O_3/SiN_x/SiO_x$, $SiO_x/SiN_x/SiO_x$, or the like.

The material of the first gate 141 may be selected from one of molybdenum, aluminum, copper, titanium, indium zinc oxide, indium tin oxide, or a combination thereof. The first gate 141 may be a single-layer structure or a multi-layer stacked structure, such as Mo, Mo/Al, Mo/Cu, MoTi/Cu, MoTi/Cu/MoTi, Ti/Al/Ti, Ti/Cu/Ti, Mo/Cu/IZO, IZO/Cu/IZO, Mo/Cu/ITO, or the like.

Alternatively, the method further includes: after Step B2, processing the first contact portion 211 and the second contact portion 212 in a conductorization process by using the first gate 141 as a mask.

The conductorization process may be an ion-doped process or a plasma conductorization process. The phosphorus ions may be doped into the first contact portion 211 and the second contact portion 212 to form an N-type heavily doped region or the boron ions may be doped into the first contact portion 211 and the second contact portion 212 to form a P-type heavily doped region.

This then proceeds to Step B3.

Figure 4:
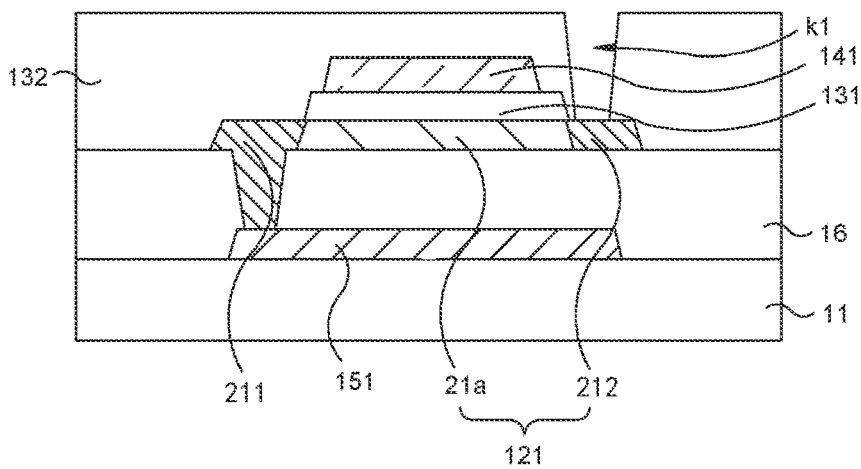
FIG. 4 is a schematic view of Step B3 of a method for manufacturing a drive substrate according to an embodiment of the present application.

At Step B3, referring to FIG. 4, a patterned second insulating layer 132 is formed on the first gate 141. The second insulating layer 132 is provided with a first opening k1, and the first opening k1 exposes the second conductor portion 21*c*.

The second insulating layer 132 covers the first gate 141, the first insulating layer 131, the first active layer 121, and the buffer layer 16.

Alternatively, the second insulating layer 132 may be a single-layer or multi-layer stacked structure, and the material of the second insulating layer 132 may be $SiO_x$, $Al_2O_3/SiN_x/SiO_x$, $SiO_x/SiN_x/SiO_x$, or the like.

It then proceeds to Step B4.

Figure 5:
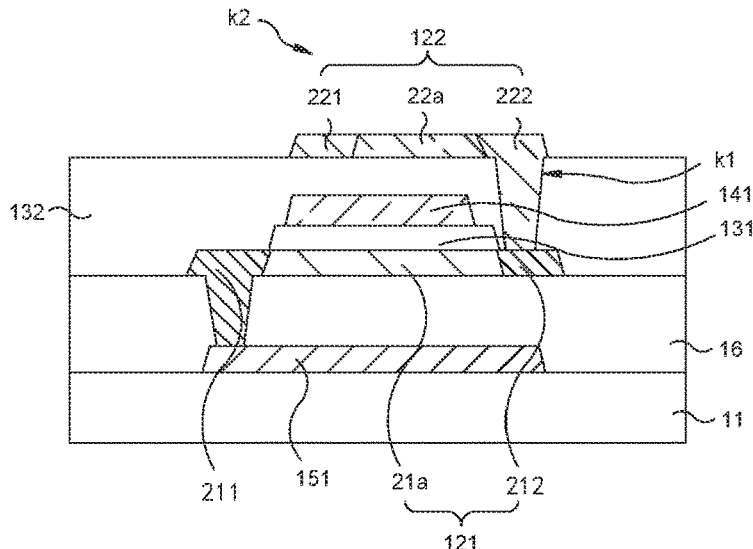
FIG. 5 is a schematic view of Step B4 of a method for manufacturing a drive substrate according to an embodiment of the present application.

At Step B4, referring to FIG. 5, the second active layer 122 is formed on the second insulating layer 132 in a region corresponding to the first channel 21*a* and the second contact portion 212. The second active layer 122 includes the third contact portion 221, the second channel 22*a*, and the fourth contact portion 222 connected in sequence. The fourth contact portion 222 overlaps the second contact portion 212, and the fourth contact portion 222 is connected to the second contact portion 212 through the first opening k1.

Alternatively, the material of the second active layer 122 may be polysilicon or metal oxide. The polysilicon may be obtained by crystallization of amorphous silicon by using a laser annealing process or other crystallization methods. The metal oxide may be, for example, IGZO, IGTO, IGZO, IGO, IZO, AIZO, ATZO, or the like.

Alternatively, the material of the second active layer 122 is the same as the material of the first active layer 121.

It then proceeds to Step B5.

Figure 6:
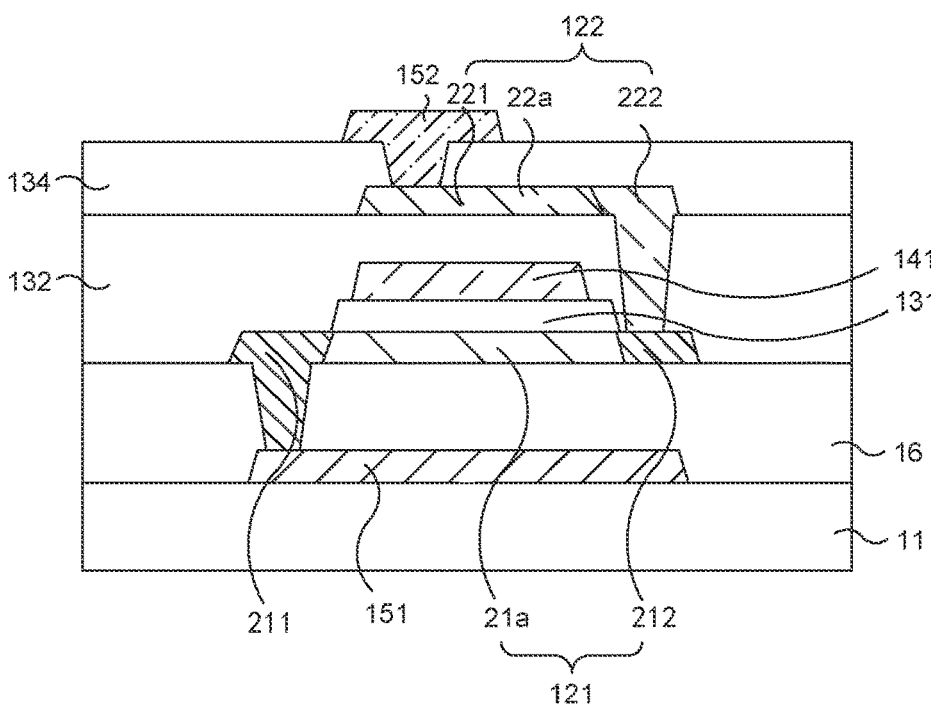
FIG. 6 is a schematic view of Step B5 of a method for manufacturing a drive substrate according to an embodiment of the present application.

At Step B5, referring to FIG. 6, the second electrode 152 is formed on the substrate 11. The first electrode 151 is connected to the first contact portion 211, and the second electrode 152 is connected to the third contact portion 221.

Note that in the present embodiment, the first electrode 151 is formed before the second electrode 152 is formed. For the forming step of the first electrode 151, refer to Step B1.

In addition, before Step B5, Step B4 further includes: forming an interlayer dielectric layer 134 on the second active layer 122. The second electrode 152 is formed on the interlayer dielectric layer 134.

Alternatively, the interlayer dielectric layer 134 may be a single-layer structure or a multi-layer stacked structure, and the material of the interlayer dielectric layer 134 may be $SiO_x$, $SiN_x$, $SiN_x/SiO_x$, $SiNO_x$, or the like.

In some embodiments, the interlayer dielectric layer 134 may be omitted, i.e., the second electrode 152 is directly lapped onto the third contact portion 221.

Alternatively, the material of the second electrode 152 may be selected from one of molybdenum, aluminum, copper, titanium, indium zinc oxide, indium tin oxide, or a combination thereof. The second electrode 152 may be a single-layer structure or a multi-layer stacked structure, such as Mo, Mo/Al, Mo/Cu, MoTi/Cu, MoTi/Cu/MoTi, Ti/Al/Ti, Ti/Cu/Ti, Mo/Cu/IZO, IZO/Cu/IZO, Mo/Cu/ITO, or the like.

It then proceeds to Step B6.

Figure 7:
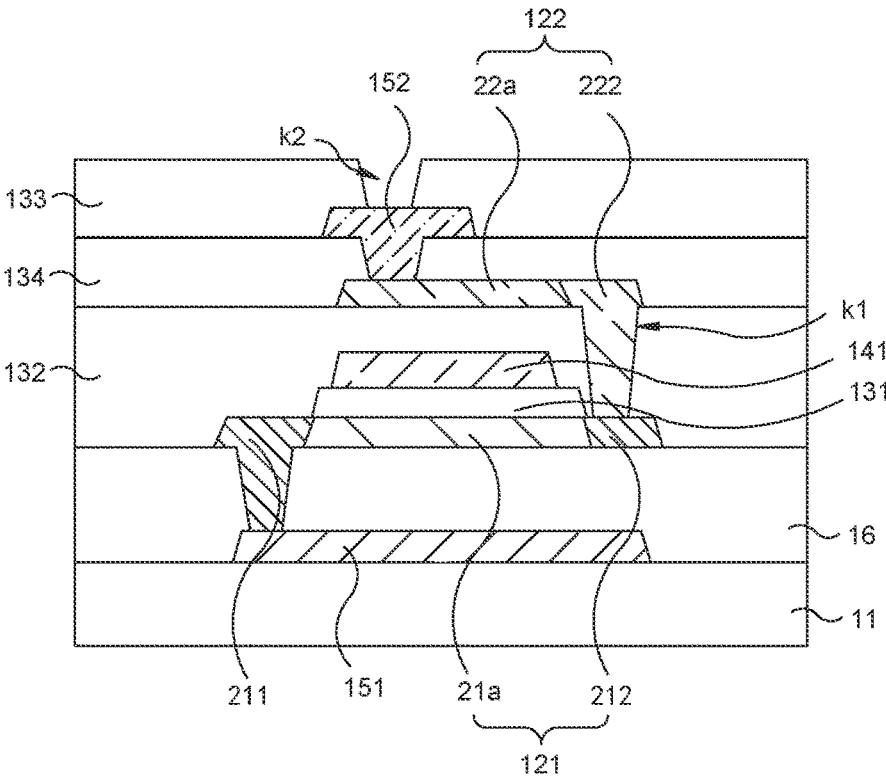
FIG. 7 is a schematic view of Step B6 of a method for manufacturing a drive substrate according to an embodiment of the present application.

At Step B6, referring to FIG. 7, the patterned third insulating layer 133 is formed on the second electrode 152. The third insulating layer 133 is provided with a second opening k2. The second opening k2 exposes the second electrode 152.

The third insulating layer 133 covers the second electrode 152 and the interlayer dielectric layer 134.

Alternatively, the material of the third insulating layer 133 may be $SiO_x$, $SiN_x$, $SiN_x/SiO_x$, $SiNO_x$, or the like.

It then proceeds to Step B7.

Figure 8:
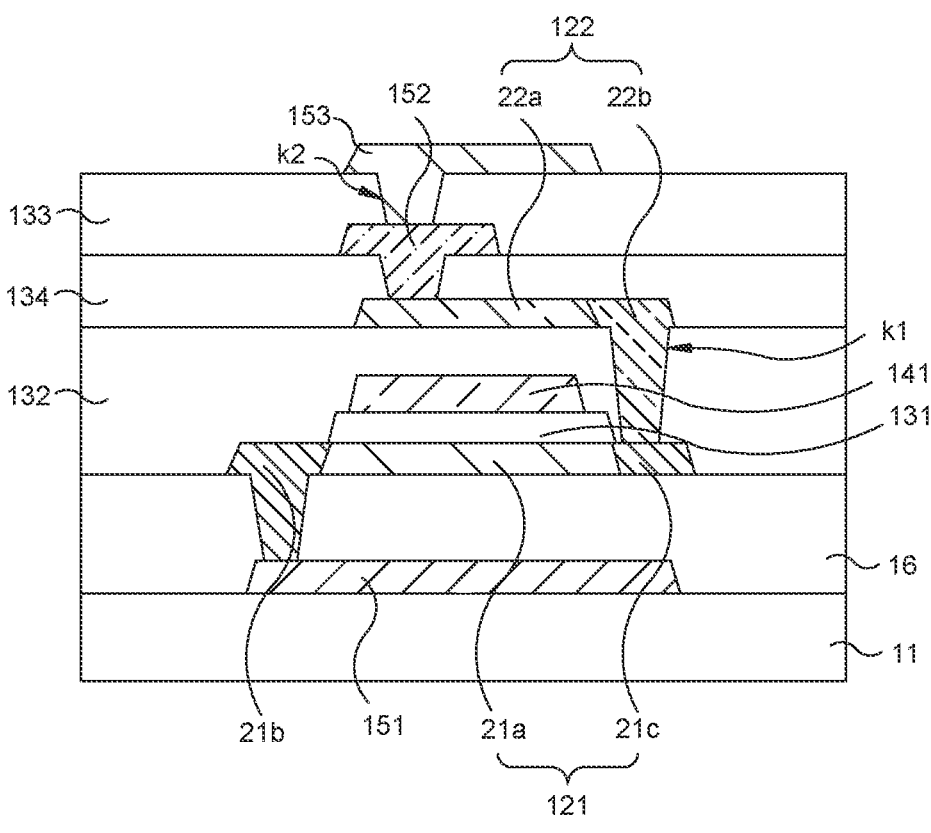
FIG. 8 is a schematic view of Step B7 of a method for manufacturing a drive substrate according to an embodiment of the present application.

At Step B7, referring to FIG. 8, the third electrode 153 is formed on the third insulating layer 133 in a region corresponding to the first gate 141, and at least the second contact portion 212 and the fourth contact portion 222 are subjected to a conductorization process by using the third electrode 153 as a mask, to form the second conductor portion 21c of the first active layer 121 and the third conductor portion 22b of the second active layer 122. The third electrode 153 is connected to the second electrode 152, and the third conductor portion 22b is connected to the second conductor portion 21c.

The third electrode 153 shields the second channel 22a, the first gate 141, and the first channel 21a, and exposes first contact portion 211, the second contact portion 212, and the fourth contact portion 222.

The first contact portion 211, the second contact portion 212, and the fourth contact portion 222 may be subjected to a conductorization process by using the third electrode 153 as a mask, to reduce steps of the method.

In the present embodiment, the first contact portion 211 and the second contact portion 212 are subjected to a conductorization process twice, so that the electrical conductivity of the first contact portion 211 and the second contact portion 212 is improved and the resistance value thereof is reduced.

In some embodiments, the first contact portion 211, the second contact portion 212, and the fourth contact portion 222 may be subjected to a conductorization process only once by using the third electrode 153 as a mask, to reduce steps of the method.

In addition, since the third electrode 153 shields the first gate 141, the third electrode 153 has a greater area, and may be used to be bonded to the light-emitting device when applied to the miniature LED panel.

Alternatively, the material of the third electrode 153 may be selected from one of molybdenum, aluminum, copper, titanium, indium zinc oxide, indium tin oxide, or a combination thereof. The third electrode 153 may be a single-layer structure or a multi-layer stacked structure, such as ITO, IZO, ITO/Ag/ITO, IZO/Ag/IZO, Mo, Mo/Al, Mo/Cu, MoTi/Cu, MoTi/Cu/MoTi, Ti/Al/Ti, Ti/Cu/Ti, Mo/Cu/IZO, IZO/Cu/IZO, Mo/Cu/ITO, or the like.

Thus, the process of manufacturing the drive substrate 100 according to the present embodiment is completed.

Embodiment 2

Figure 9:
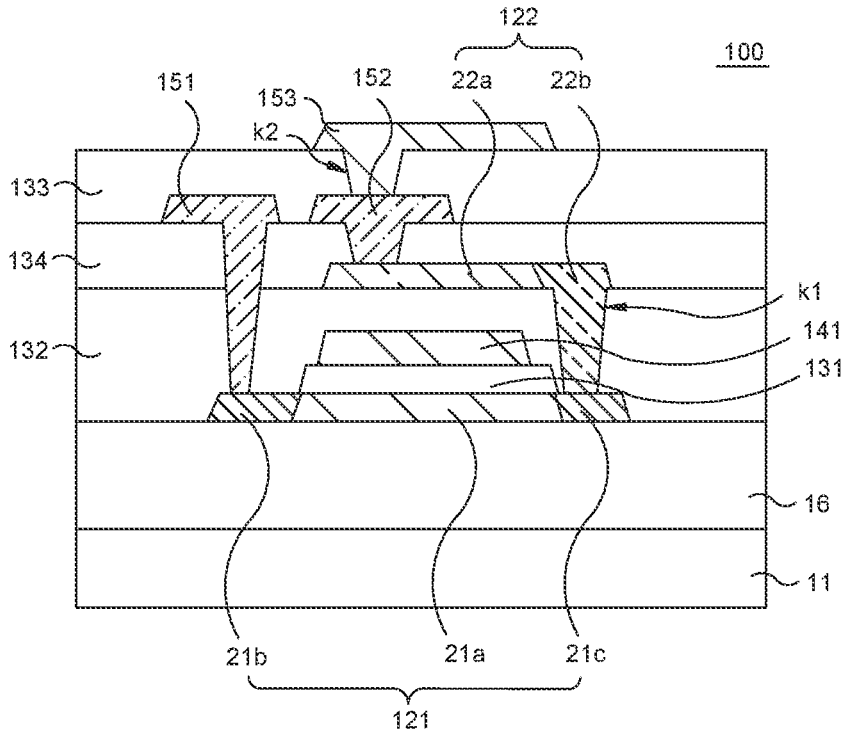
FIG. 9 is a schematic view of a drive substrate according to another embodiment of the present application.

Referring to FIG. 9, the second embodiment differs from the first embodiment in that the first electrode 151 and the second electrode 152 are arranged in the same layer and spaced apart from each other. The first electrode 151 and the second electrode 152 are both disposed on the second active layer 122.

Alternatively, the resistance value of the second conductor portion 21c is lesser than the resistance value of the third conductor portion 22b to increase the conductivity.

It should be noted that since the first electrode 151 and the second electrode 152 are disposed in the same layer, two conductorization processes are required in this embodiment. For details, refer to the following steps of the manufacturing method.

Accordingly, the present embodiment of the present application further provides a method for manufacturing a drive substrate 100, which includes the following steps:

At Step B11, a first active layer 121 is formed on a substrate 11. The first active layer 121 includes a first contact portion 211, a first channel 21a, and a second contact portion 212 connected in sequence.

At Step B12, a first insulating layer 131 and a first gate 141 are formed on the first active layer 121. The first gate 141 corresponds to the first channel 21a.

At Step B13, a second insulating layer 132 is formed on the first gate 141.

At Step B14, a second active layer 122 is formed on the second insulating layer 132 in a region corresponding to the first channel 21a and the second contact portion 212. The second active layer 122 includes a third contact portion 221, a second channel 22a, and a fourth contact portion 222 connected in sequence. The fourth contact portion 222 overlaps the second contact portion 212, and the fourth contact portion 222 is connected to the second contact portion 212.

At Step B15, a first electrode 151 and a second electrode 152 are formed on the substrate 11. The first electrode 151 is connected to the first contact portion 211, and the second electrode 152 is connected to the third contact portion 221.

At Step B16, a third insulating layer 133 is formed on the second electrode 152.

At Step B17, a third electrode 153 is formed on the third insulating layer 133 in a region corresponding to the first gate 141, and at least the second contact portion 212 and the fourth contact portion 222 are subjected to a conductorization process by using the third electrode 153 as a mask, to form a second conductor portion 21c of the first active layer 121 and a third conductor portion 22*b* of the second active layer 122. The third electrode 153 is connected to the second electrode 152, and the third conductor portion 22*b* is connected to the second conductor portion 21*c*.

The method of manufacturing the drive substrate 100 is described below.

Figure 10:
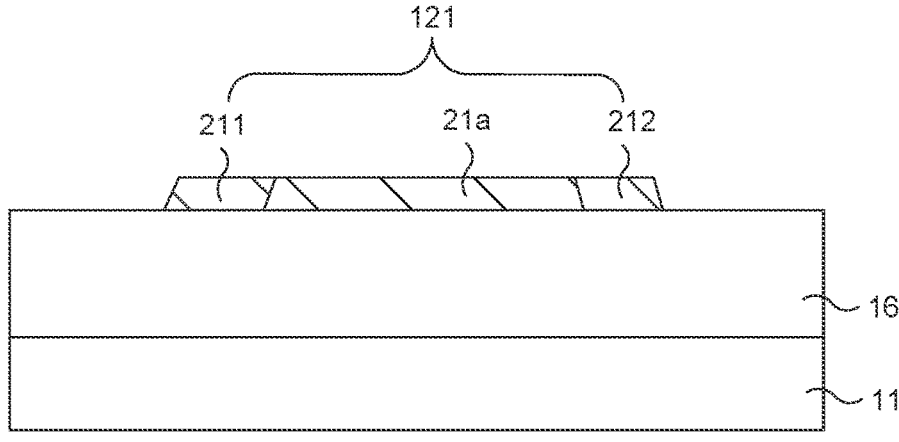
FIG. 10 is a schematic view of Step B11 of a method for manufacturing a drive substrate according to another embodiment of the present application.

At Step B11, referring to FIG. 10, the first active layer 121 is formed on the substrate 11. The first active layer 121 includes the first contact portion 211, the first channel 21*a*, and the second contact portion 212 connected in sequence.

Alternatively, the method further includes: before Step B11, forming a buffer layer 16 on the substrate 11, the buffer layer 16 covering the substrate 11.

It then proceeds to Step B12.

Figure 11:
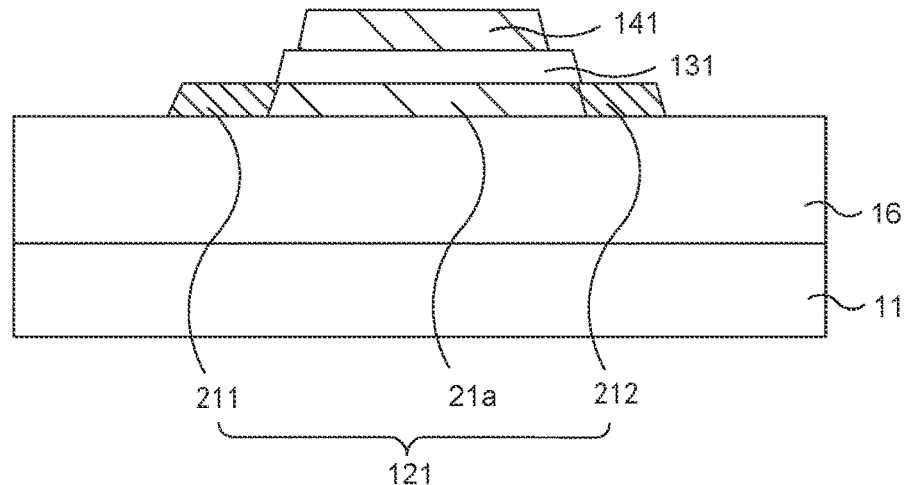
FIG. 11 is a schematic view of Step B12 of a method for manufacturing a drive substrate according to another embodiment of the present application.

At Step B12, referring to FIG. 11, the first insulating layer 131 and the first gate 141 are formed on the first active layer 121. The first gate 141 corresponds to the first channel 21*a*.

Alternatively, the first insulating layer 131 may be a single-layer structure or a multi-layer stacked structure, and the material of the first insulating layer 131 may be $SiO_x$, $Al_2O_3/SiN_x/SiO_x$, $SiO_x/SiN_x/SiO_x$, or the like.

The material of the first gate 141 may be selected from one of molybdenum, aluminum, copper, titanium, indium zinc oxide, indium tin oxide, or a combination thereof. The first gate 141 may be a single-layer structure or a multi-layer stacked structure, such as Mo, Mo/Al, Mo/Cu, MoTi/Cu, MoTi/Cu/MoTi, Ti/Al/Ti, Ti/Cu/Ti, Mo/Cu/IZO, IZO/Cu/IZO, Mo/Cu/ITO, or the like.

Alternatively, the method further includes: after Step B12, processing the first contact portion 211 and the second contact portion 212 in a conductorization process by using the first gate 141 as a mask.

The conductorization process may be an ion-doped process or a plasma conductorization process. The phosphorus ions may be doped into the first contact portion 211 and the second contact portion 212 to form an N-type heavily doped region or the boron ions may be doped into the first contact portion 211 and the second contact portion 212 to form a P-type heavily doped region.

Then, the flow proceeds to Step B13.

Figure 12:
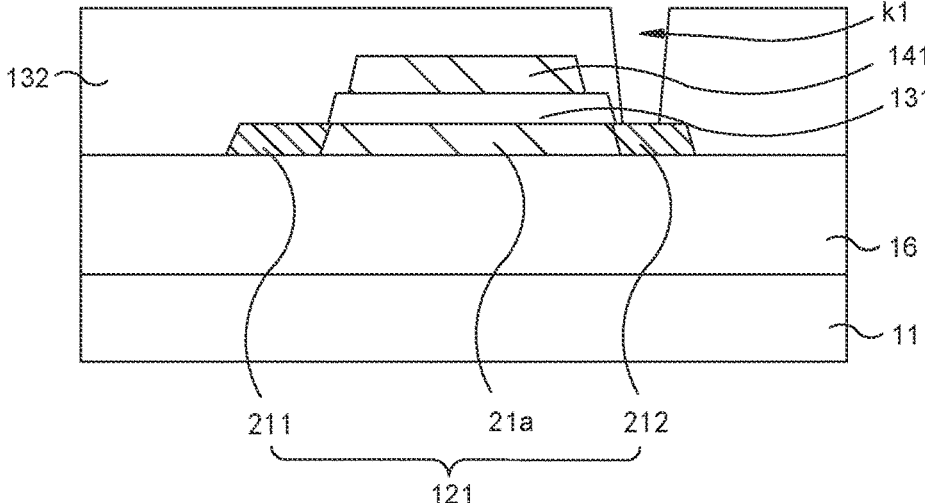
FIG. 12 is a schematic view of Step B13 of a method for manufacturing a drive substrate according to another embodiment of the present application.

At Step B13, referring to FIG. 12, a patterned second insulating layer 132 is formed on the first gate 141. The second insulating layer 132 is provided with a first opening k1, and the first opening k1 exposes the second conductor portion 21*c*.

The second insulating layer 132 covers the first gate 141, the first insulating layer 131, the first active layer 121, and the buffer layer 16.

Alternatively, the second insulating layer 132 may be a single-layer or multi-layer stacked structure, and the material of the second insulating layer 132 may be $SiO_x$, $Al_2O_3/SiN_x/SiO_x$, $SiO_x/SiN_x/SiO_x$, or the like.

Then, the flow proceeds to Step B14.

Figure 13:
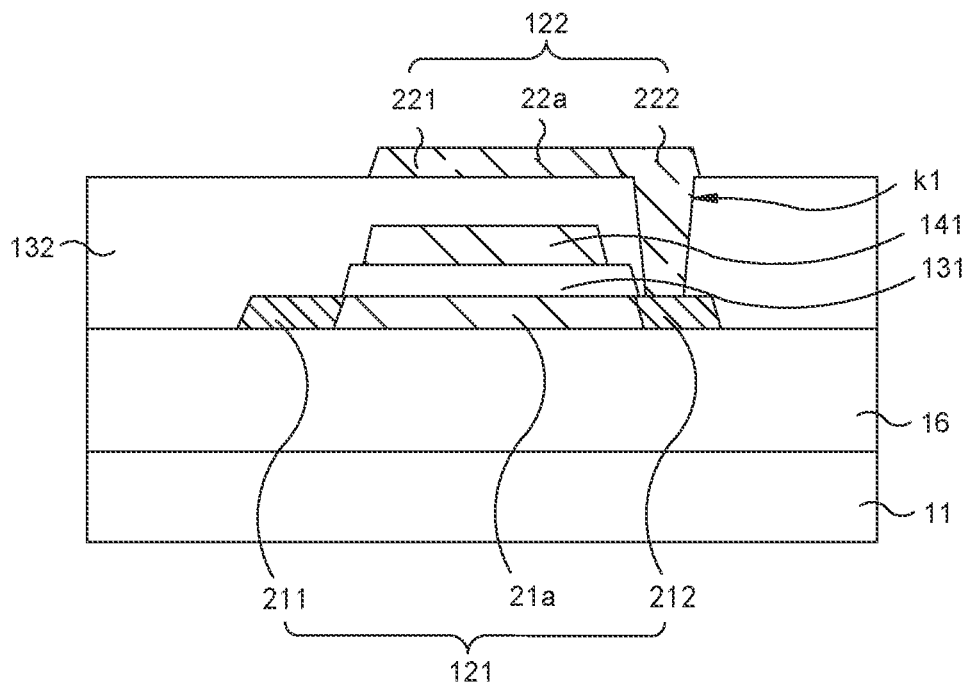
FIG. 13 is a schematic view of Step B14 of a method for manufacturing a drive substrate according to another embodiment of the present application.

At Step B14, referring to FIG. 13, the second active layer 122 is formed on the second insulating layer 132 in a region corresponding to the first channel 21*a* and the second contact portion 212. The second active layer 122 includes the third contact portion 221, the second channel 22*a*, and the fourth contact portion 222 connected in sequence. The fourth contact portion 222 overlaps the second contact portion 212, and the fourth contact portion 222 is connected to the second contact portion 212 through the first opening k1.

Alternatively, the material of the second active layer 122 may be polysilicon or metal oxide. The polysilicon may be obtained by crystallization of amorphous silicon by using a laser annealing process or other crystallization methods. The metal oxide may be, for example, IGZO, IGTO, IGZO, IGO, IZO, AIZO, ATZO, or the like.

Alternatively, the material of the second active layer 122 is the same as the material of the first active layer 121.

Then, the flow proceeds to Step B15.

Figure 14:
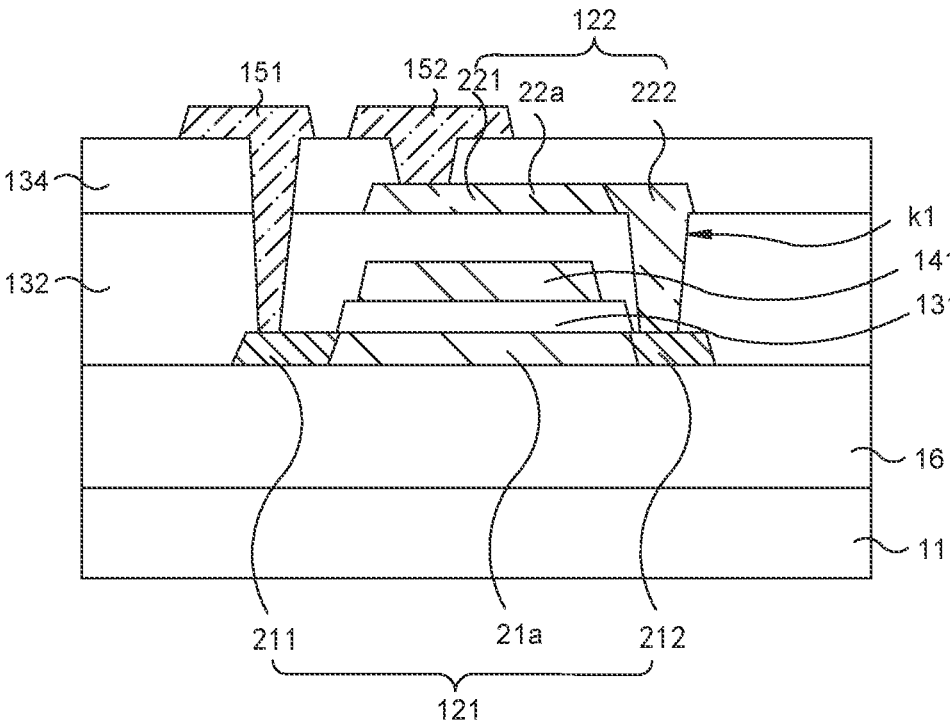
FIG. 14 is a schematic view of Step B15 of a method for manufacturing a drive substrate according to another embodiment of the present application.

At Step B15, referring to FIG. 14, the first electrode 151 and the second electrode 152 are formed on the substrate 11. The first electrode 151 is connected to the first contact portion 211, and the second electrode 152 is connected to the third contact portion 221.

In addition, before Step B15, Step B14 further includes: forming an interlayer dielectric layer 134 on the second active layer 122. The interlayer dielectric layer 134 covers the second active layer 122. The first electrode 151 and the second electrode 152 are formed on the interlayer dielectric layer 134.

Alternatively, the interlayer dielectric layer 134 may be a single-layer structure or a multi-layer stacked structure, and the material of the interlayer dielectric layer 134 may be $SiO_x$, $SiN_x$, $SiN_x/SiO_x$, $SiNO_x$, or the like.

In some embodiments, the interlayer dielectric layer 134 may be omitted, i.e., the second electrode 152 is directly lapped onto the third contact portion 221.

Alternatively, the materials of the first electrode 151 and the second electrode 152 may each be selected from one of molybdenum, aluminum, copper, titanium, indium zinc oxide, indium tin oxide, or a combination thereof. Each of the first electrode 151 and the second electrode 152 may be a single-layer structure or a multi-layer stacked structure, such as Mo, Mo/Al, Mo/Cu, MoTi/Cu, MoTi/Cu/MoTi, Ti/Al/Ti, Ti/Cu/Ti, Mo/Cu/IZO, IZO/Cu/IZO, Mo/Cu/ITO, or the like.

Then, the flow proceeds to Step B16.

Figure 15:
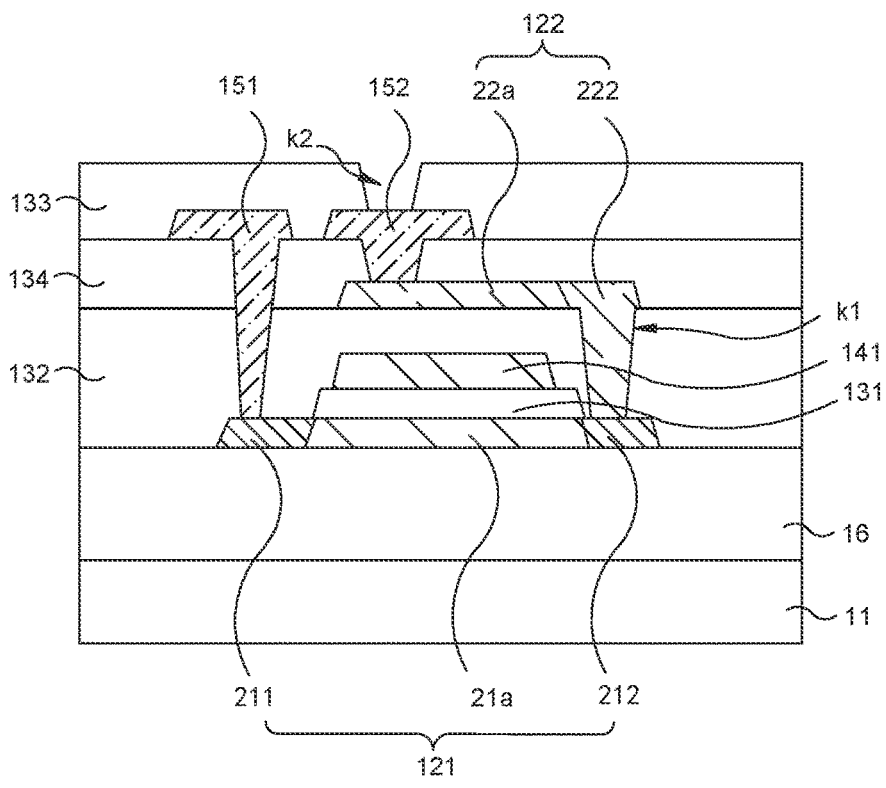
FIG. 15 is a schematic view of Step B16 of a method for manufacturing a drive substrate according to another embodiment of the present application.

At Step B16, referring to FIG. 15, the patterned third insulating layer 133 is formed on the second electrode 152. The third insulating layer 133 is provided with a second opening k2. The second opening k2 exposes the second electrode 152.

The third insulating layer 133 covers the second electrode 152 and the interlayer dielectric layer 134.

Alternatively, the material of the third insulating layer 133 may be $SiO_x$, $SiN_x$, $SiN_x/SiO_x$, $SiNO_x$, or the like.

Then, the flow proceeds to step B17.

Figure 16:
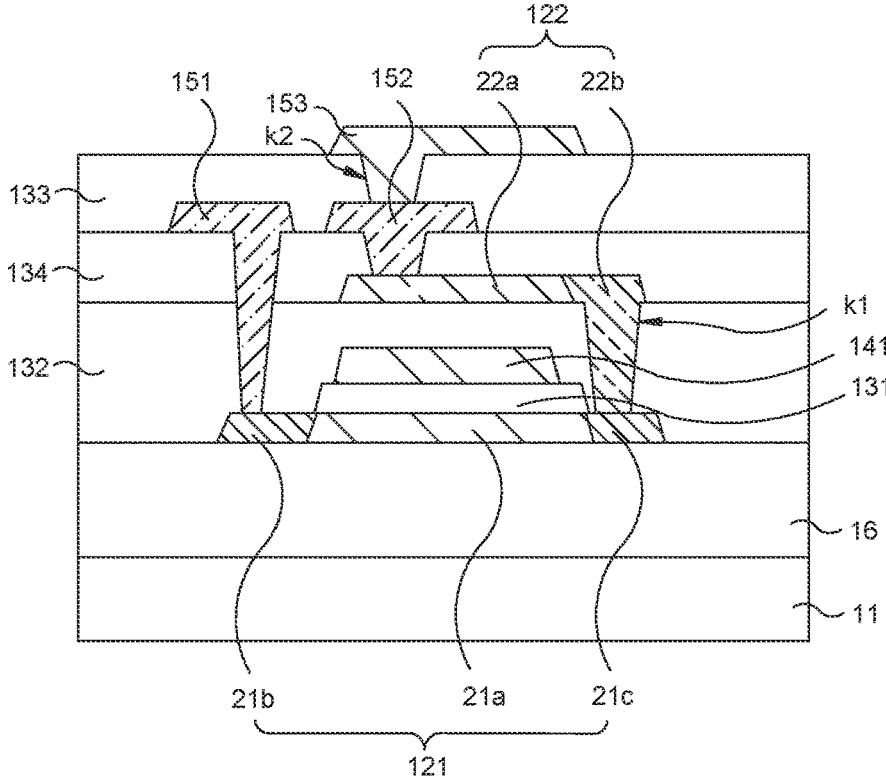
FIG. 16 is a schematic view of Step B17 of a method for manufacturing a drive substrate according to another embodiment of the present application.

At Step B17, referring to FIG. 16, the third electrode 153 is formed on the third insulating layer 133 in a region corresponding to the first gate 141, and at least the second contact portion 212 and the fourth contact portion 222 are subjected to a conductorization process by using the third electrode 153 as a mask, to form the second conductor portion 21*c* of the first active layer 121 and the third conductor portion 22*b* of the second active layer 122. The third electrode 153 is connected to the second electrode 152 through the second opening k2, and the third conductor portion 22*b* is connected to the second conductor portion 21*c*.

The third electrode 153 shields the second channel 22*a*, the first gate 141, and the first channel 21*a*, and exposes the second contact portion 212 and the fourth contact portion 222.

The second contact portion 212 and the fourth contact portion 222 may be subjected to a conductorization process by using the third electrode 153 as a mask, to reduce steps of the method.

In the present embodiment, the second contact portion 212 is subjected to a conductorization process twice, so that the electrical conductivity of the second contact portion 212 is improved and the resistance value thereof is reduced.

In addition, since the third electrode 153 shields the first gate 141, the third electrode 153 has a greater area, and may be used to be bonded to the light-emitting device when applied to the miniature LED panel.

Alternatively, the material of the third electrode 153 may be selected from one of molybdenum, aluminum, copper, titanium, indium zinc oxide, indium tin oxide, or a combination thereof. The third electrode 153 may be a single-layer structure or a multi-layer stacked structure, such as ITO, IZO, ITO/Ag/ITO, IZO/Ag/IZO, Mo, Mo/Al, Mo/Cu, MoTi/Cu, MoTi/Cu/MoTi, Ti/Al/Ti, Ti/Cu/Ti, Mo/Cu/IZO, IZO/Cu/IZO, Mo/Cu/ITO, or the like.

Thus, the process of manufacturing the drive substrate 100 according to the present embodiment is completed.

Embodiment 3

Figure 17:
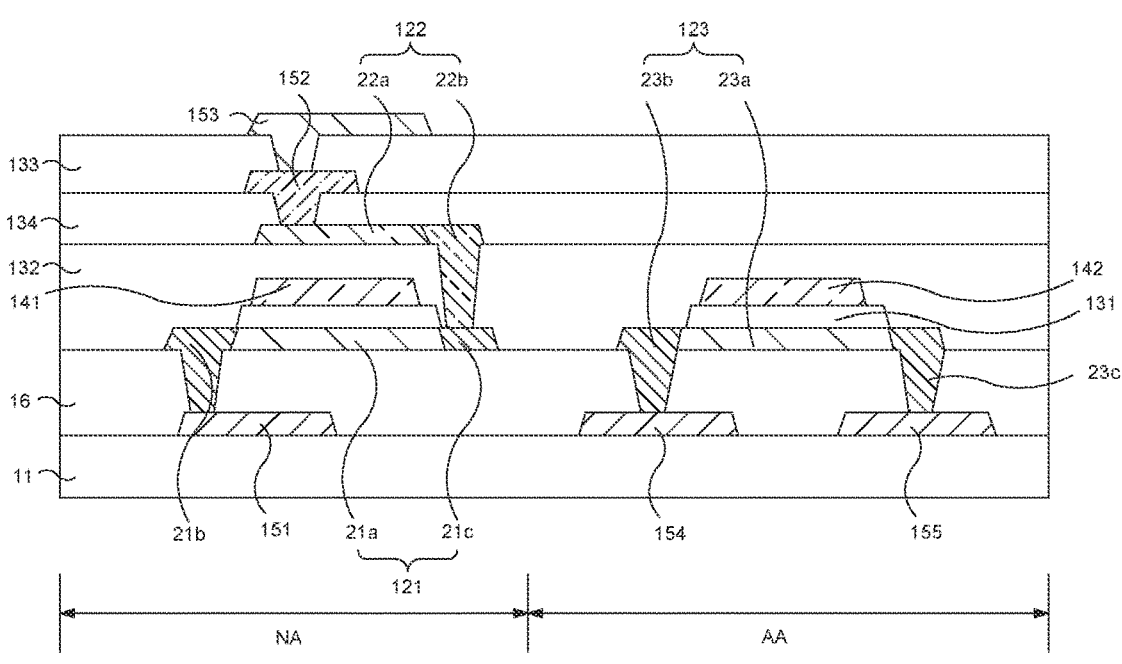
FIG. 17 is a schematic view of a drive substrate according to yet another embodiment of the present application.

On the basis of Embodiment 1 or Embodiment 2, in Embodiment 3, referring to FIG. 17, the drive substrate 100 further includes a third active layer 123, a second gate 142, a fourth electrode 154, and a fifth electrode 155. The third active layer 123 is the same layer as and spaced apart from the first active layer 121. The third active layer 123 includes a third channel 23*a*, a fourth conductor portion 23*b*, and a fifth conductor portion 23*c*. The fourth conductor portion 23*b* is connected to a side of the third channel 23*a*, and the fifth conductor portion 23*c* is connected to the other side of the third channel 23*a*. The second gate 142 is the same layer as and spaced apart from the first gate 141. The fourth electrode 154 is connected to the fourth conductor portion 23*b*. The fifth electrode 155 is connected to the fifth conductor portion 23*c*.

The drive substrate 100 includes a display region AA and a non-display region NA located at at least one side of the display region AA. The first active layer 121, the second active layer 122, the first gate 141, the first electrode 151, and the second electrode 152 are configured to form a first thin film transistor. The third active layer 123, the second gate 142, the fourth electrode 154, and the fifth electrode 155 are configured to form a second thin film transistor.

The first thin film transistor is arranged in the non-display region NA. The second thin film transistor is disposed in the display region AA.

In the present embodiment, a first thin film transistor having a higher mobility and a narrower channel is disposed in the non-display region NA, so that an area of the non-display region NA may be reduced, a narrower frame may be realized, and the system drive cost for a panel may be reduced. The first thin film transistor may be used for at least one of a gate drive circuit and a Demux (multiplex) circuit source driving circuit.

In addition, the first active layer 121 and the third active layer 123 are disposed in the same layer, and the first gate 141 and the second gate 142 are disposed in the same layer, so that the number of the used photomasks may be reduced. That is, the first active layer 121 and the third active layer 123 are simultaneously formed by one photomask, and the first gate 141 and the second gate 142 are simultaneously formed by another photomask.

Alternatively, the resistance value of the second conductor portion 21*c* is lesser than the resistance value of the fifth conductor portion 23*c*, thereby increasing the conductivity of the first thin film transistor.

Alternatively, Embodiment 3 is described on the basis of Embodiment 1, but is not limited thereto. That is, the fourth electrode 154, the fifth electrode 155, and the first electrode 151 are disposed in the same layer.

Among them, one of the fourth electrode 154 and the fifth electrode 155 is a source and the other is a drain.

Figure 18:
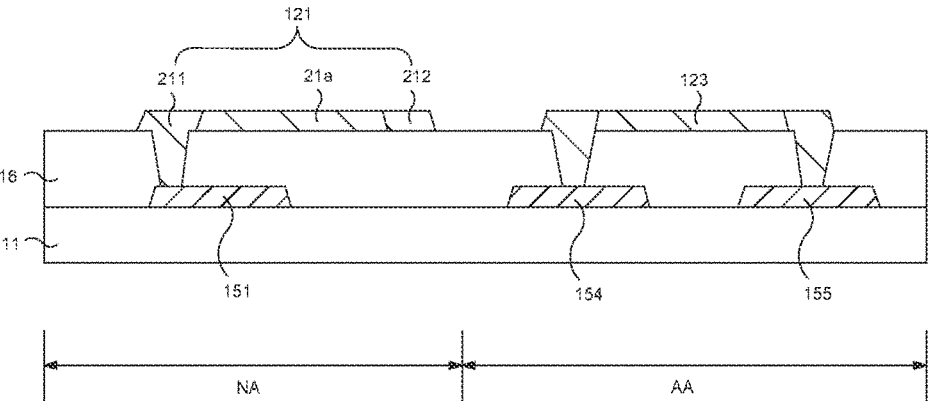
FIG. 18 is a schematic view of Step B21 of a method for manufacturing a drive substrate according to yet another embodiment of the present application.

The method of manufacturing the drive substrate 100 according to the present embodiment includes the following steps:

At Step B21, referring to FIG. 18, a first metal layer, a buffer layer 16, and an active mother layer are sequentially formed on the substrate 11.

The first metal layer includes a first electrode 151, a fourth electrode 154, and a fifth electrode 155. The active mother layer includes a first active layer 121 and a third active layer 123.

The first electrode 151, the fourth electrode 154, and the fifth electrode 155 are formed by using a same mask, and the first active layer 121 and the third active layer 123 are also formed by using a same mask, to achieve the effect of saving the masks.

The first electrode 151, the fourth electrode 154, and the fifth electrode 155 have a same material. The first active layer 121 and the third active layer 123 have a same material.

The material of the first electrode 151 may be selected from one of molybdenum, aluminum, copper, titanium, indium zinc oxide, and indium tin oxide, or a combination thereof. The first electrode 151 may be a single-layer structure or a multi-layer stacked structure such as Mo, Mo/Al, Mo/Cu, MoTi/Cu, MoTi/Cu/MoTi, Ti/Al/Ti, Ti/Cu/Ti, Mo/Cu/IZO, IZO/Cu/IZO, or Mo/Cu/ITO.

The material of the first active layer 121 may be polysilicon or metal oxide. The polysilicon may be obtained by crystallization of amorphous silicon by using a laser annealing process or other crystallization methods. The metal oxide may be, for example, IGZO, IGTO, IGZO, IGO, IZO, AIZO, ATZO, or the like.

Then, the flow proceeds to Step B22.

Figure 19:
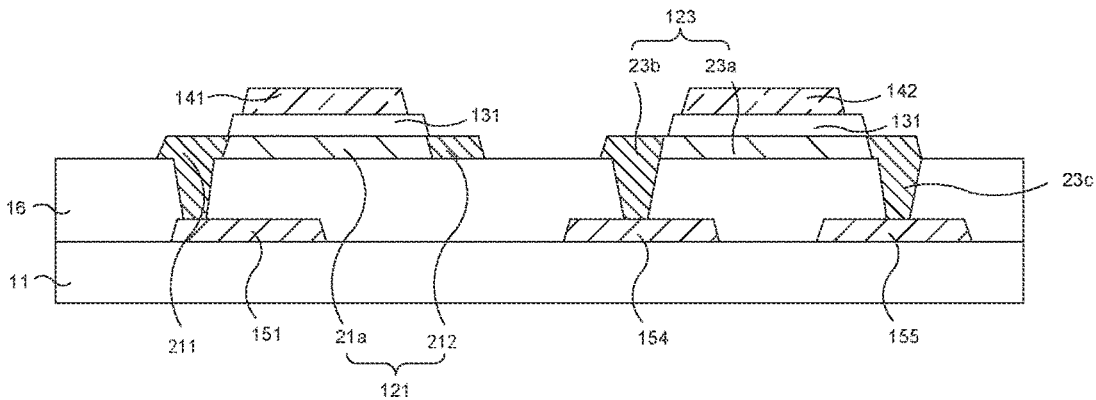
FIG. 19 is a schematic view of Step B22 of a method for manufacturing a drive substrate according to yet another embodiment of the present application.

At Step B22, referring to FIG. 19, a first insulating layer 131 and a second metal layer are sequentially formed on the active mother layer, and the active mother layer is subjected to a conductorization process by using the second metal layer as a mask.

A first insulating layer 131 is disposed between the active mother layer and the second metal layer. The second metal layer includes a first gate 141 and a second gate 142.

The first contact portion 211 and the second contact portion 212 of the first active layer 121 are subjected to a conductorization process by using the first gate 141 as a mask. The fifth contact portion and the sixth contact portion of the third active layer 123 are subjected to a conductorization process by using the second gate 142 as a mask, to form a fourth conductor portion 23*b* and a fifth conductor portion 23*c*.

In some embodiments, the conductorization process may be omitted in Step B22, and the conductorization processes may be reduced by performing the conductorization process once in Step B25.

The first gate 141 and the second gate 142 are formed by using the same mask, and the first gate 141 and the second gate 142 have the same materials. The second gate 142 may have materials as described in the above description of the first gate 141, and details are not described herein.

Then, the process proceeds to Step B23.

Figure 20:
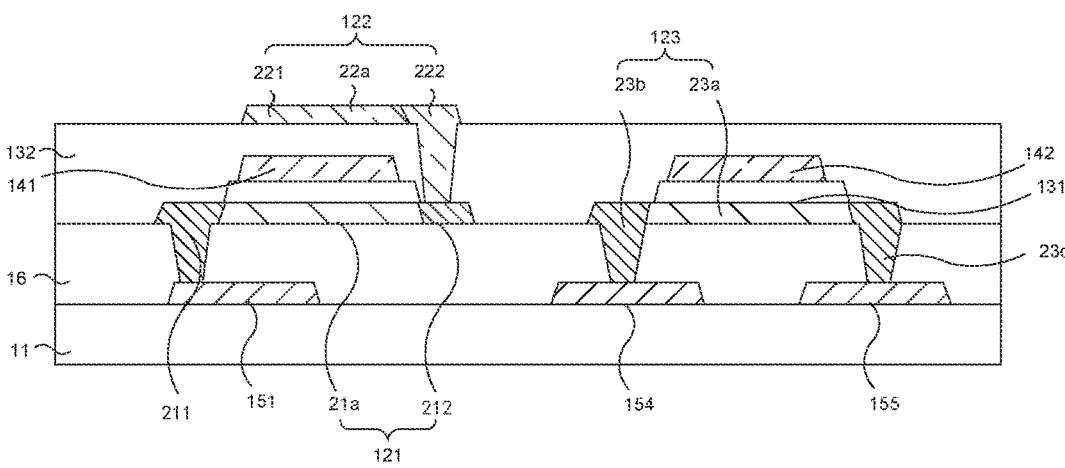
FIG. 20 is a schematic view of Step B23 of a method for manufacturing a drive substrate according to yet another embodiment of the present application.

At Step B23, referring to FIG. 20, a second insulating layer 132 and a second active layer 122 are sequentially formed on the second metal layer.

The second insulating layer 132 covers the second metal layer and the buffer layer 16.

With respect to the second insulating layer 132 and the second active layer 122, reference is made to the description of the second insulating layer 132 and the second active layer 122 in the above-described embodiments.

Then, the flow proceeds to Step B24.

Figure 21:
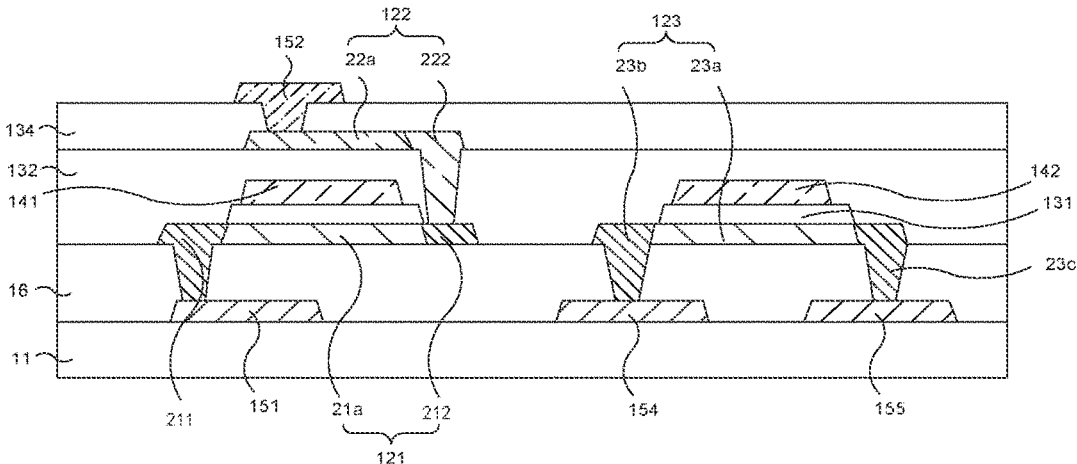
FIG. 21 is a schematic view of Step B24 of a method for manufacturing a drive substrate according to yet another embodiment of the present application.

At Step B24, referring to FIG. 21, an interlayer dielectric layer 134 and a second electrode 152 are sequentially formed on the second active layer 122.

With respect to the interlayer dielectric layer 134 and the second electrode 152, reference is made to the description of the interlayer dielectric layer 134 and the second electrode 152 in the above-described embodiments.

Then, the flow proceeds to Step B25.

Figure 22:
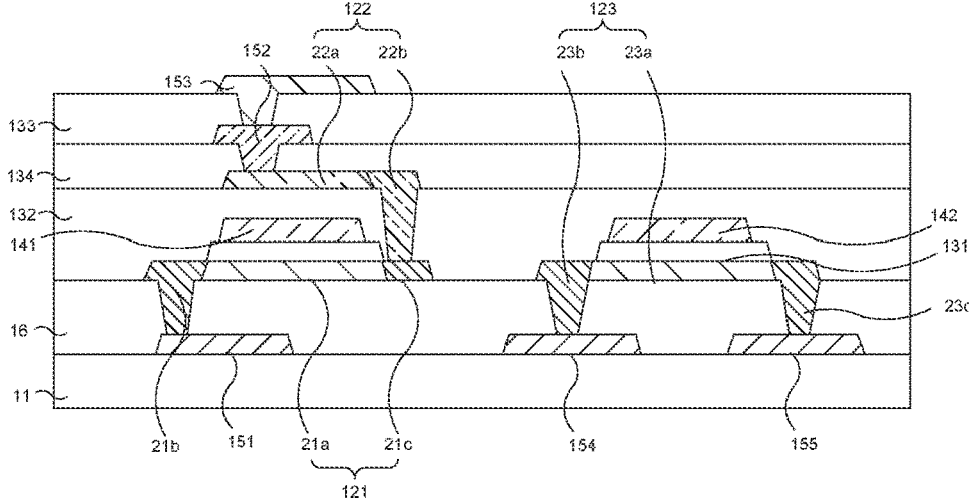
FIG. 22 is a schematic view of Step B25 of a method for manufacturing a drive substrate according to yet another embodiment of the present application.

At Step B25, referring to FIG. 22, a third insulating layer 133 and a third electrode 153 are sequentially formed on the second electrode 152. The first contact portion 211, the second contact portion 212, and the fourth contact portion 222 are subjected to a conductorization process by using the third electrode 153 as a mask.

The third insulating layer 133 covers the second electrode 152 and the interlayer dielectric layer 134.

The third electrode 153 shields the second channel 22a, the first gate 141, and the first channel 21a, and exposes the first contact portion 211, the second contact portion 212, and the fourth contact portion 222.

The first contact portion 211, the second contact portion 212, and the fourth contact portion 222 are subjected to a conductorization process by using the third electrode 153 as a mask to reduce steps in the method.

In the present embodiment, the first contact portion 211 and the second contact portion 212 are subjected to a conductorization process twice, so that the electrical conductivity of the first contact portion 211 and the second contact portion 212 is improved and the resistance value thereof is reduced.

In some embodiments, no conductorization process is performed in Step B22. In Step B25, the first active layer 121, the second active layer 122, and the third active layer 123 may be subjected to the conductorization process by using the second gate 142 and the third electrode 153 as masks, and the first conductor portion 21b, the second conductor portion 21c, the third conductor portion 22b, the fourth conductor portion 23b, and the fifth conductor portion 23c may be formed in a same process.

Thus, the process of manufacturing the drive substrate 100 according to the present embodiment is completed.

Embodiment 4

Figure 23:
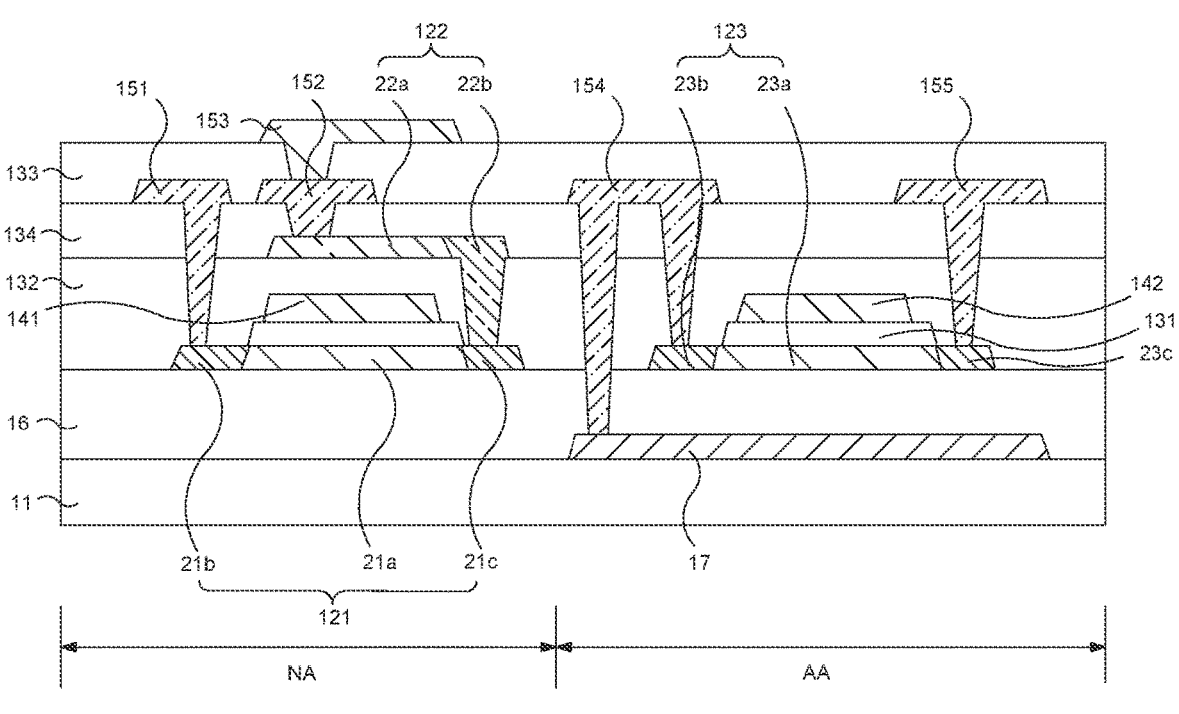
FIG. 23 is a schematic view of a drive substrate according to still another embodiment of the present application.

Referring to FIG. 23, Embodiment 4 differs from Embodiment 3 in that the first electrode 151, the second electrode 152, the fourth electrode 154, and the fifth electrode 155 are disposed in the same layer, and each of them is disposed above the second active layer 122.

The drive substrate 100 further includes a light shielding layer 17 disposed between the buffer layer 16 and the substrate 11. A fourth electrode 154 is connected to the light shielding layer 17.

Embodiment 4 is described on the basis of Embodiment 2, but is not limited thereto.

Figure 24:
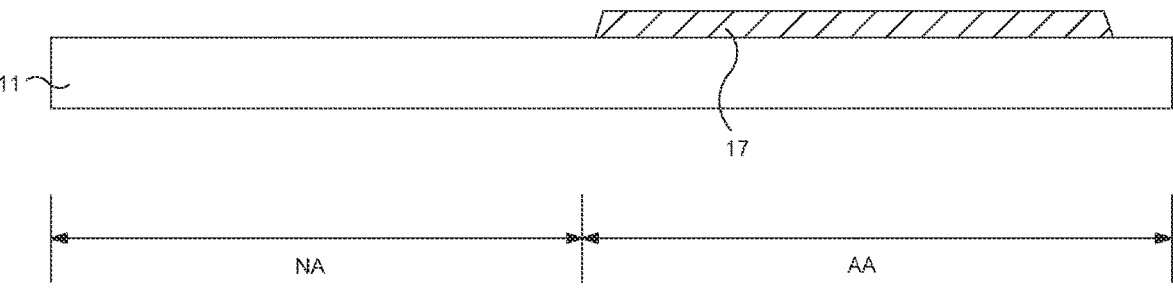
FIG. 24 is a schematic view of Step B31 of a method for manufacturing a drive substrate according to still another embodiment of the present application.

A process of manufacturing the drive substrate 100 according to Embodiment 4 includes the following steps:

At Step B31, referring to FIG. 24, a light shielding layer 17 is formed on the substrate 11 in an area corresponding to the display region AA. Then, the process proceeds to Step B32.

Figure 25:
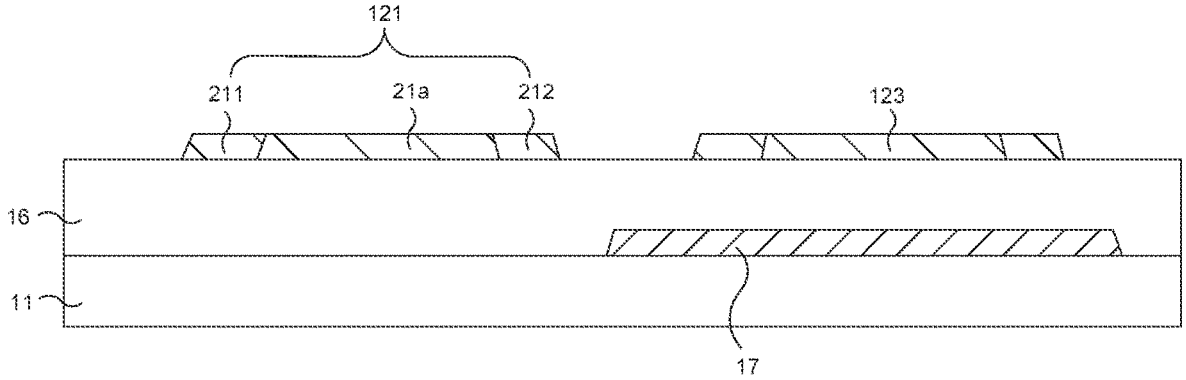
FIG. 25 is a schematic view of Step B32 of a method for manufacturing a drive substrate according to still another embodiment of the present application.

At Step B32, referring to FIG. 25, a buffer layer 16 and an active mother layer are sequentially formed on the substrate 11. The buffer layer 16 covers the light shielding layer 17 and the substrate 11. The active mother layer includes a first active layer 121 and a third active layer 123. The third active layer 123 is disposed overlapping the light shielding layer 17. The first active layer 121 and the third active layer 123 are formed by using the same mask. Then, the flow proceeds to Step B33.

Figure 26:
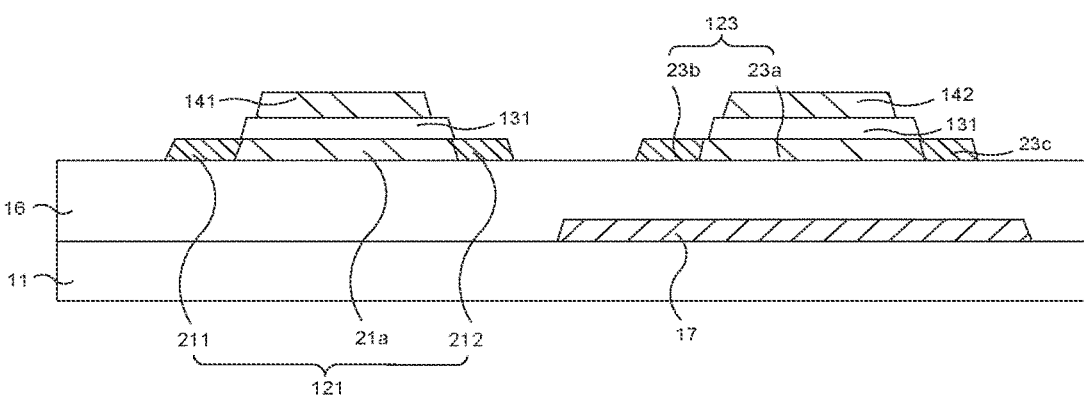
FIG. 26 is a schematic view of Step B33 of a method for manufacturing a drive substrate according to still another embodiment of the present application.

At Step B33, referring to FIG. 26, a first insulating layer 131 and a gate metal layer are formed on the buffer layer 16. The first active layer 121 and the third active layer 123 may be subjected to the conductorization process by using the gate metal layer as a mask. The gate metal layer includes a first gate 141 and a second gate 142. The first gate 141 and the second gate 142 are formed by using the same mask. Then, the flow proceeds to Step B34.

Figure 27:
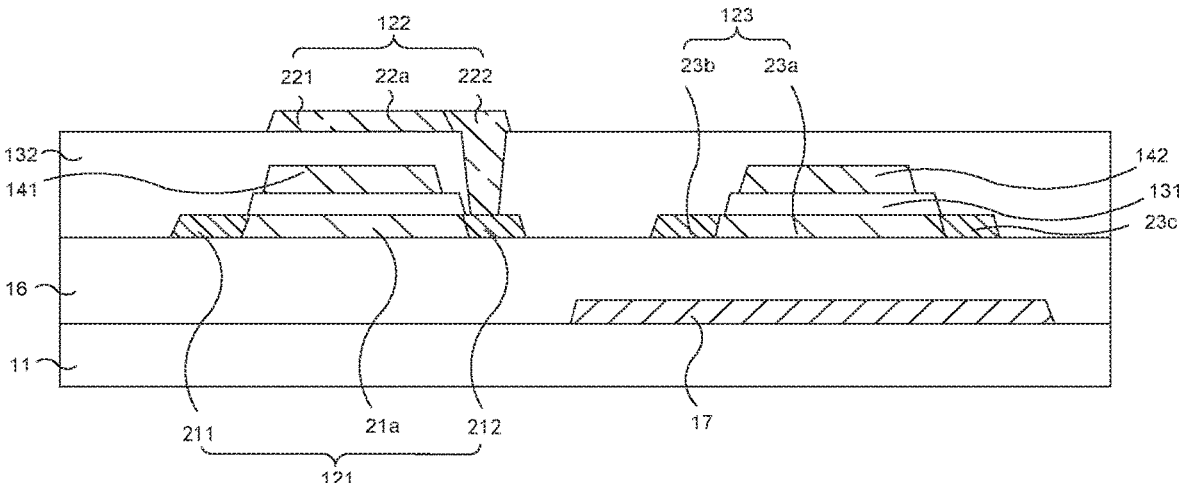
FIG. 27 is a schematic view of Step B34 of a method for manufacturing a drive substrate according to still another embodiment of the present application.

At Step B34, referring to FIG. 27, a second insulating layer 132 and a second active layer 122 are sequentially formed on the metal layer. The second active layer 122, the first active layer 121, and the third active layer 123 have a same material. Then, the flow proceeds to Step B35.

Figure 28:
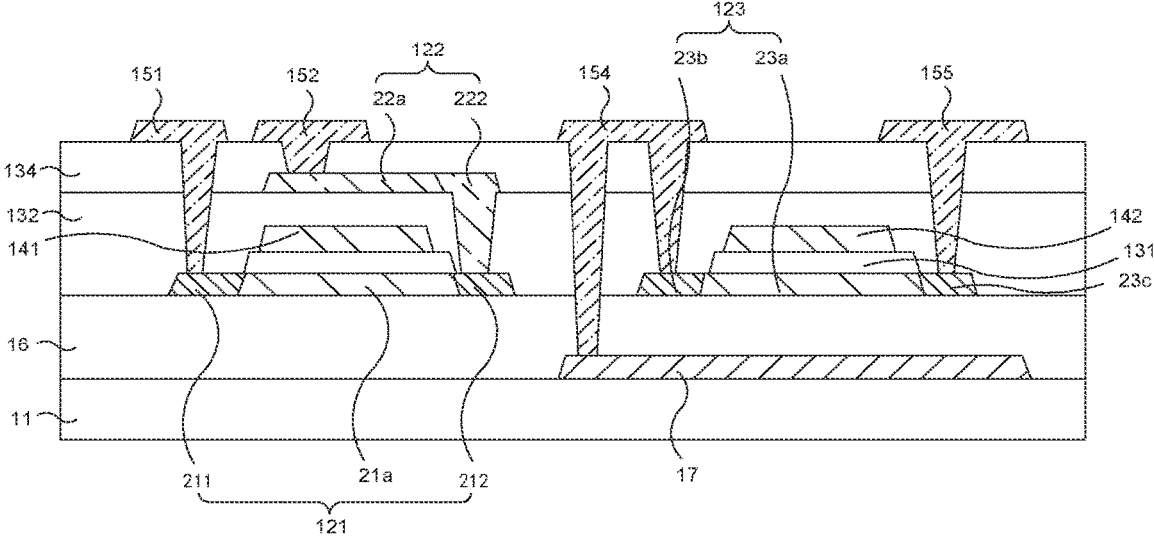
FIG. 28 is a schematic view of Step B35 of a method for manufacturing a drive substrate according to still another embodiment of the present application.

At Step B35, referring to FIG. 28, an interlayer dielectric layer 134 and a source/drain metal layer are sequentially formed on the second active layer 122. The source/drain metal layer includes a first electrode 151, a second electrode 152, a fourth electrode 154, and a fifth electrode 155. The first electrode 151 is connected to the first conductor portion 21b, the second electrode 152 is connected to a side of the second channel 22a close to the first electrode 151, the fourth electrode 154 is connected to the fourth conductor portion 23b and the light shielding layer 17, and the fifth electrode 155 is connected to the fifth conductor portion 23c.

That is, the first electrode 151, the second electrode 152, the fourth electrode 154, and the fifth electrode 155 are formed by using the same mask, and the first electrode 151, the second electrode 152, the fourth electrode 154, and the fifth electrode 155 have the same materials. Then, the flow proceeds to Step B36.

Figure 29:
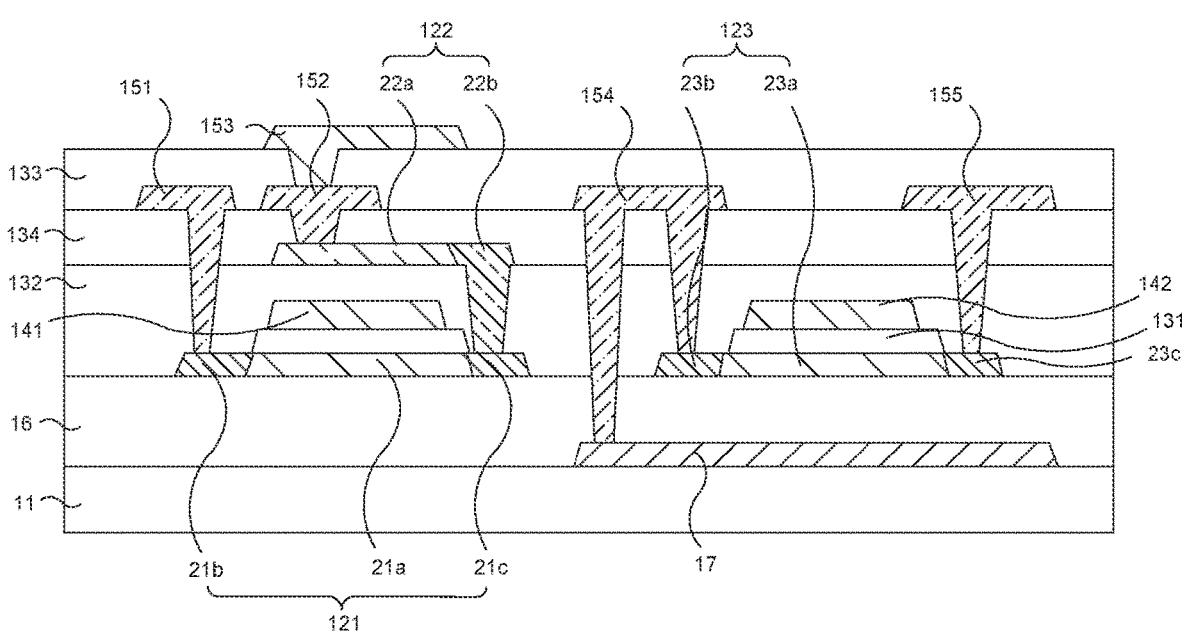
FIG. 29 is a schematic view of Step B36 of a method for manufacturing a drive substrate according to still another embodiment of the present application.

At Step B36, referring to FIG. 29, a third insulating layer 133 and a third electrode 153 are sequentially formed on the source/drain metal layers, and the second active layer 122 is subjected to a conductorization process by using the third electrode 153 as a mask.

Thus, the process of manufacturing the drive substrate 100 according to the present embodiment is completed.

Embodiment 5

Figure 30:
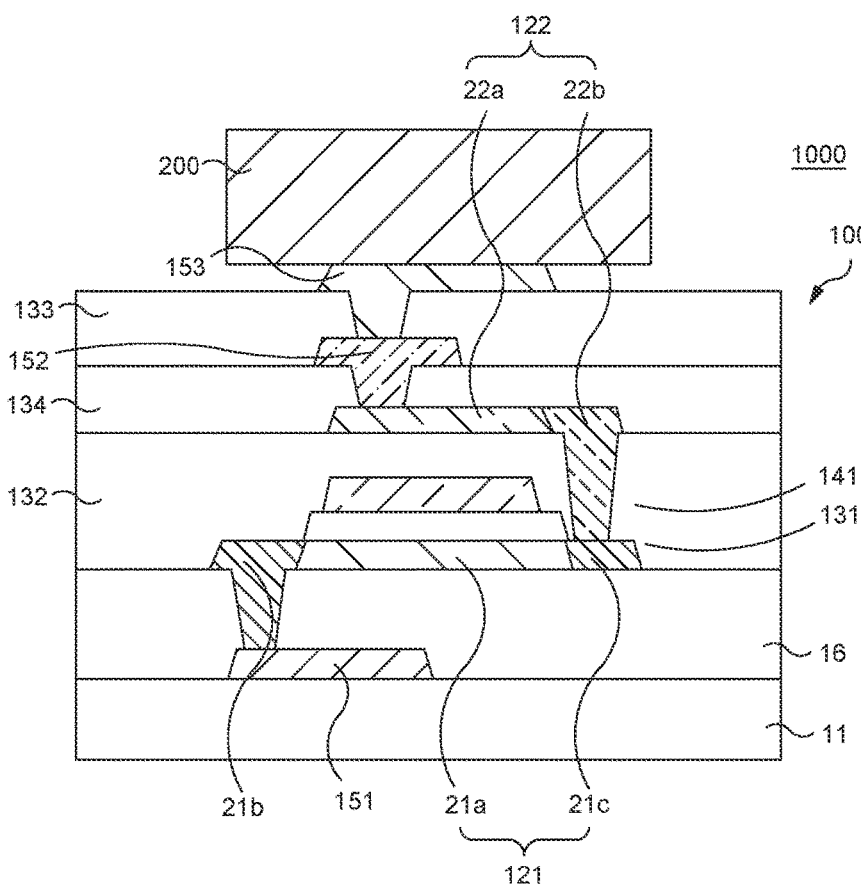
FIG. 30 is a schematic view of a display panel according to still another embodiment of the present application.

Accordingly, referring to FIG. 30, an embodiment of the present application further provides a display panel 1000 including a drive substrate 100 according to any one of the above-described embodiments and a light emitting device 200 disposed on the drive substrate 100.

Embodiment 5 is illustrated on the basis of Embodiment 1, but is not limited thereto.

In a display panel 1000 according to an embodiment of the present application, a first active layer 121, a first gate 141, a second active layer 122, a first electrode 151, and a second electrode 152 are included in a drive substrate 100 to form a thin film transistor. The thin film transistor adopts an architecture in which the shared first gate 141 and the dual active layers (the first active layer 121 and the second active layer 122) are provided, to improve the mobility of the driving thin film transistor. In addition, in a manufacturing process, at least the second conductor portion 21c and the third conductor portion 22b are formed by a same doping or conductorization process by using the third electrode 153 as a mask, so that the doping or conductorization processes are reduced.

Next, when the thin film transistor is configured to drive the light-emitting device 200 such as a miniature light-emitting diode, since the third electrode 153 is used as a mask, to shield the first channel 21$a$ and the first gate 141, the thin film transistor has a greater area, thereby facilitating bonding of a pin of the light-emitting device to the third electrode 153.

The present application has been described in detail with reference to a drive substrate, a manufacturing method, and a display panel according to embodiments of the present application. The principles and embodiments of the present application are described herein by using specific examples. The description of the above embodiments is merely provided to help understand the methods and core concepts of the present application. At the same time, variations will occur to those skilled in the art in both the detailed description and the scope of application in accordance with the teachings of the present application. In view of the foregoing, the present description should not be construed as limiting the application.

What is claimed is:

1. A drive substrate comprising:
a substrate;
a first active layer disposed on the substrate, the first active layer comprising a first channel, a first conductor portion connected to a side of the first channel, and a second conductor portion connected to other side of the first channel;
a first insulating layer disposed on the first active layer;
a first gate disposed on the first insulating layer and overlapping the first channel;
a second insulating layer disposed on the first gate and provided with a first opening;
a second active layer disposed on the second insulating layer, wherein the second active layer comprises a second channel and a third conductor portion connected to a side of the second channel, and the third conductor portion is connected to the second conductor portion through the first opening, and is provided to overlap the second conductor portion;
a first electrode and a second electrode disposed on the substrate, wherein the first electrode is connected to the first conductor portion, the second electrode is disposed on the second active layer and connected to a side of the second active layer away from the third conductor portion;
a third insulating layer disposed on the first electrode and the second electrode and provided with a second opening; and
a third electrode disposed on the third insulating layer, wherein the third electrode is connected to the second electrode through the second opening, and the third electrode shields the first channel and the second channel in a direction in which the drive substrate is orthographically projected, and exposes at least the second conductor portion and the third conductor portion.

2. The drive substrate of claim 1, wherein the drive substrate further comprises a buffer layer disposed between the substrate and the first active layer, the first electrode is disposed between the buffer layer and the substrate, and the third electrode further exposes the first conductor portion.

3. The drive substrate of claim 2, wherein the first electrode shields the first channel and the second channel, and the first electrode comprises a light shielding material.

4. The drive substrate of claim 2, wherein a resistance value of the first conductor portion and a resistance value of the second conductor portion are both lesser than a resistance value of the third conductor portion.

5. The drive substrate of claim 1, wherein the first electrode and the second electrode are arranged in a same layer and spaced apart from each other.

6. The drive substrate of claim 5, wherein a resistance value of the second conductor portion is lesser than a resistance value of the third conductor portion.

7. The drive substrate of claim 1, wherein the first channel and the second channel have a same material.

8. The drive substrate of claim 1, wherein the drive substrate further comprises a third active layer, a second gate, a fourth electrode, and a fifth electrode, wherein the third active layer is disposed in a same layer as and spaced apart from the first active layer, the third active layer comprises a third channel, a fourth conductor portion, and a fifth conductor portion, the fourth conductor portion is connected to a side of the third channel, and the fifth conductor portion is connected to other side of the third channel, the second gate is a same layer as and spaced apart from the first gate, the fourth electrode is connected to the fourth conductor portion, and the fifth electrode is connected to the fifth conductor portion;
wherein the drive substrate comprises a display region and a non-display region located at at least one side of the display region, and the first active layer, the second active layer, the first gate, the first electrode, and the second electrode are configured to form a first thin film transistor, and the third active layer, the second gate, the fourth electrode, and the fifth electrode are configured to form a second thin film transistor; and
wherein the first thin film transistor is disposed in the non-display region, and the second thin film transistor is disposed in the display region.

9. The drive substrate of claim 8, wherein a resistance value of the second conductor portion is lesser than a resistance value of the fifth conductor portion.

10. A display panel comprises a drive substrate and a light emitting device disposed on the drive substrate, the drive substrate comprising:
a substrate;
a first active layer disposed on the substrate, the first active layer comprising a first channel, a first conductor portion connected to a side of the first channel, and a second conductor portion connected to other side of the first channel;
a first insulating layer disposed on the first active layer;
a first gate disposed on the first insulating layer and overlapping the first channel;
a second insulating layer disposed on the first gate and provided with a first opening;
a second active layer disposed on the second insulating layer, wherein the second active layer comprises a second channel and a third conductor portion connected to a side of the second channel, and the third conductor portion is connected to the second conductor portion through the first opening, and is provided to overlap the second conductor portion;
a first electrode and a second electrode disposed on the substrate, wherein the first electrode is connected to the first conductor portion, the second electrode is disposed on the second active layer and connected to a side of the second active layer away from the third conductor portion;

a third insulating layer disposed on the first electrode and the second electrode and provided with a second opening; and a third electrode disposed on the third insulating layer, wherein the third electrode is connected to the second electrode through the second opening, and the third electrode shields the first channel and the second channel in a direction in which the drive substrate is orthographically projected, and exposes at least the second conductor portion and the third conductor portion.

11. The display panel of claim 10, wherein the drive substrate further comprises a buffer layer disposed between the substrate and the first active layer, the first electrode is disposed between the buffer layer and the substrate, and the third electrode further exposes the first conductor portion.

12. The display panel of claim 11, wherein the first electrode shields the first channel and the second channel, and the first electrode comprises a light shielding material.

13. The display panel of claim 11, wherein a resistance value of the first conductor portion and a resistance value of the second conductor portion are both lesser than a resistance value of the third conductor portion.

14. The display panel of claim 10, wherein the first electrode and the second electrode are arranged in a same layer and spaced apart from each other.

15. The display panel of claim 14, wherein a resistance value of the second conductor portion is lesser than a resistance value of the third conductor portion.

16. The display panel of claim 10, wherein the first channel and the second channel have a same material.

17. The display panel of claim 11, wherein the drive substrate further comprises a third active layer, a second gate, a fourth electrode, and a fifth electrode, wherein the third active layer is disposed in a same layer as and spaced apart from the first active layer, the third active layer comprises a third channel, a fourth conductor portion, and a fifth conductor portion, the fourth conductor portion is connected to a side of the third channel, and the fifth conductor portion is connected to other side of the third channel, the second gate is a same layer as and spaced apart from the first gate, the fourth electrode is connected to the fourth conductor portion, and the fifth electrode is connected to the fifth conductor portion;

wherein the drive substrate comprises a display region and a non-display region located at at least one side of the display region, and the first active layer, the second active layer, the first gate, the first electrode, and the second electrode are configured to form a first thin film transistor, and the third active layer, the second gate, the fourth electrode, and the fifth electrode are configured to form a second thin film transistor; and wherein the first thin film transistor is disposed in the non-display region, and the second thin film transistor is disposed in the display region.

18. The display panel of claim 17, wherein a resistance value of the second conductor portion is lesser than a resistance value of the fifth conductor portion.

19. A method of manufacturing a drive substrate comprises:

forming a first active layer on the substrate, wherein the first active layer comprises a first contact portion, a first channel, and a second contact portion connected in sequence;

forming a first insulating layer on the first active layer;

forming a first gate on the first insulating layer in a region corresponding to the first channel;

forming a second insulating layer on the first gate;

forming a second active layer on the second insulating layer in a region corresponding to the first channel and the second contact portion, wherein the second active layer comprises a third contact portion, a second channel, and a fourth contact portion connected in sequence, the fourth contact portion overlaps the second contact portion, and the fourth contact portion is connected to the second contact portion;

forming a first electrode and a second electrode on the substrate, wherein the first electrode is connected to the first contact portion, and the second electrode is connected to and disposed on the third contact portion;

forming a third insulating layer on the second electrode; and forming a third electrode on the third insulating layer in a region corresponding to the first gate, and performing a conductorization process on at least the second contact portion and the fourth contact portion by using the third electrode as a mask, to form a second conductor portion of the first active layer and a third conductor portion of the second active layer, wherein the third electrode is connected to the second electrode, and the third conductor portion is connected to the second conductor portion.

20. The method of claim 19, wherein the method further comprises: after forming the first gate, performing a conductorization process on the first contact portion and the second contact portion by using the first gate as a mask, to form the first conductor portion and the second conductor portion.

* * * * *